(12) United States Patent
Kubo et al.

(10) Patent No.: US 7,282,821 B2
(45) Date of Patent: Oct. 16, 2007

(54) LINEAR MOTOR, STAGE APPARATUS, EXPOSURE APPARATUS, AND DEVICE MANUFACTURING APPARATUS

(75) Inventors: Hiroyoshi Kubo, Tochiqi-ken (JP); Keiji Emoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 272 days.

(21) Appl. No.: 11/138,567

(22) Filed: May 27, 2005

(65) Prior Publication Data
US 2005/0285451 A1 Dec. 29, 2005

Related U.S. Application Data

(63) Continuation-in-part of application No. 10/674,359, filed on Oct. 1, 2003, now abandoned, and a continuation-in-part of application No. 10/347,862, filed on Jan. 22, 2003, now abandoned.

(30) Foreign Application Priority Data

Jan. 28, 2002 (JP) ............... 2002-018939
Oct. 23, 2002 (JP) ............... 2002-308058

(51) Int. Cl.
*H02K 9/19* (2006.01)
*H01L 21/00* (2006.01)

(52) U.S. Cl. ..................................... 310/12
(58) Field of Classification Search ............. 310/12, 310/16
See application file for complete search history.

(56) References Cited

U.S. PATENT DOCUMENTS

| | | | |
|---|---|---|---|
| 4,542,311 A | 9/1985 | Newman et al. | 310/13 |
| 5,642,013 A | 6/1997 | Wavre | 310/254 |
| 6,084,319 A | 7/2000 | Kamata et al. | 310/12 |
| 6,114,781 A | 9/2000 | Hazelton et al. | 310/12 |
| 6,226,073 B1 | 5/2001 | Emoto | 355/53 |
| 6,359,678 B1 | 3/2002 | Ota | 355/53 |
| 6,363,809 B1 | 4/2002 | Novak et al. | 74/490.09 |
| 6,552,773 B2 | 4/2003 | Emoto | 355/53 |
| 6,700,253 B1 | 3/2004 | Ohnuma et al. | 10/89 |
| 6,762,516 B2 | 7/2004 | Maruyama | 310/12 |
| 2001/0055102 A1 | 12/2001 | Emoto | 355/53 |
| 2002/0000029 A1 | 1/2002 | Emoto | 29/25.01 |
| 2002/0075467 A1 | 6/2002 | Tanaka et al. | 355/57 |

(Continued)

FOREIGN PATENT DOCUMENTS

DE 2851569 6/1980

(Continued)

OTHER PUBLICATIONS

Translation of German Patent No. 2851569, 2004.

(Continued)

*Primary Examiner*—Karl Tamai
*Assistant Examiner*—David W. Scheuermann
(74) *Attorney, Agent, or Firm*—Fitzpatrick, Cella, Harper & Scinto

(57) ABSTRACT

In a linear motor, each arrayed coil unit (160) of a stator yoke (151) is divided into an upper coil (161) and lower coil (162). A cooling pipe (153) is interposed between the upper coil (161) and the lower coil (162).

31 Claims, 22 Drawing Sheets

U.S. PATENT DOCUMENTS

| | | |
|---|---|---|
| 2002/0081528 A1 | 6/2002 | Miyajima et al. ........... 430/302 |
| 2002/0180946 A1 | 12/2002 | Bisschops et al. ............ 355/72 |
| 2003/0007136 A1 | 1/2003 | Emoto et al. ................. 355/30 |
| 2003/0035088 A1 | 2/2003 | Emoto ......................... 355/53 |

FOREIGN PATENT DOCUMENTS

| | | |
|---|---|---|
| JP | 10-97966 | 4/1998 |
| JP | 10-257750 | 9/1998 |
| JP | 10-511837 | 11/1998 |
| JP | 11-243052 | 9/1999 |
| JP | 2003-141769 | 5/2003 |

OTHER PUBLICATIONS

Translation of Japanese Patent No. 10-97966, 2003.

FIG. 19

| | |
|---|---|
| URL | http://www.maintain.co.jp/db/input.html |

TROUBLE DB INPUT WINDOW

OCCURRENCE DATE OF TROUBLE  [2000/3/15] ~4040
MODEL  [* * * * * * * * *] ~4010
SUBJECT [OPERATION ERROR (START-UP ERROR)] ~4030
DEVICE S/N  [465NS4580001] ~4020
DEGREE OF URGENCY  [D] ~4050

SYMPTOM  [LED KEEPS FLICKERING AFTER POWER ON.] ~4060

REMEDY  [POWER ON AGAIN (PRESS RED BUTTON IN ACTIVATION.)] ~4070

PROGRESS  [INTERIM HAS BEEN DONE.] ~4080

[SEND] [RESET]   4100                 4110              4120
         LINK TO RESULT LIST DATABASE   SOFTWARE LIBRARY   OPERATION GUIDE

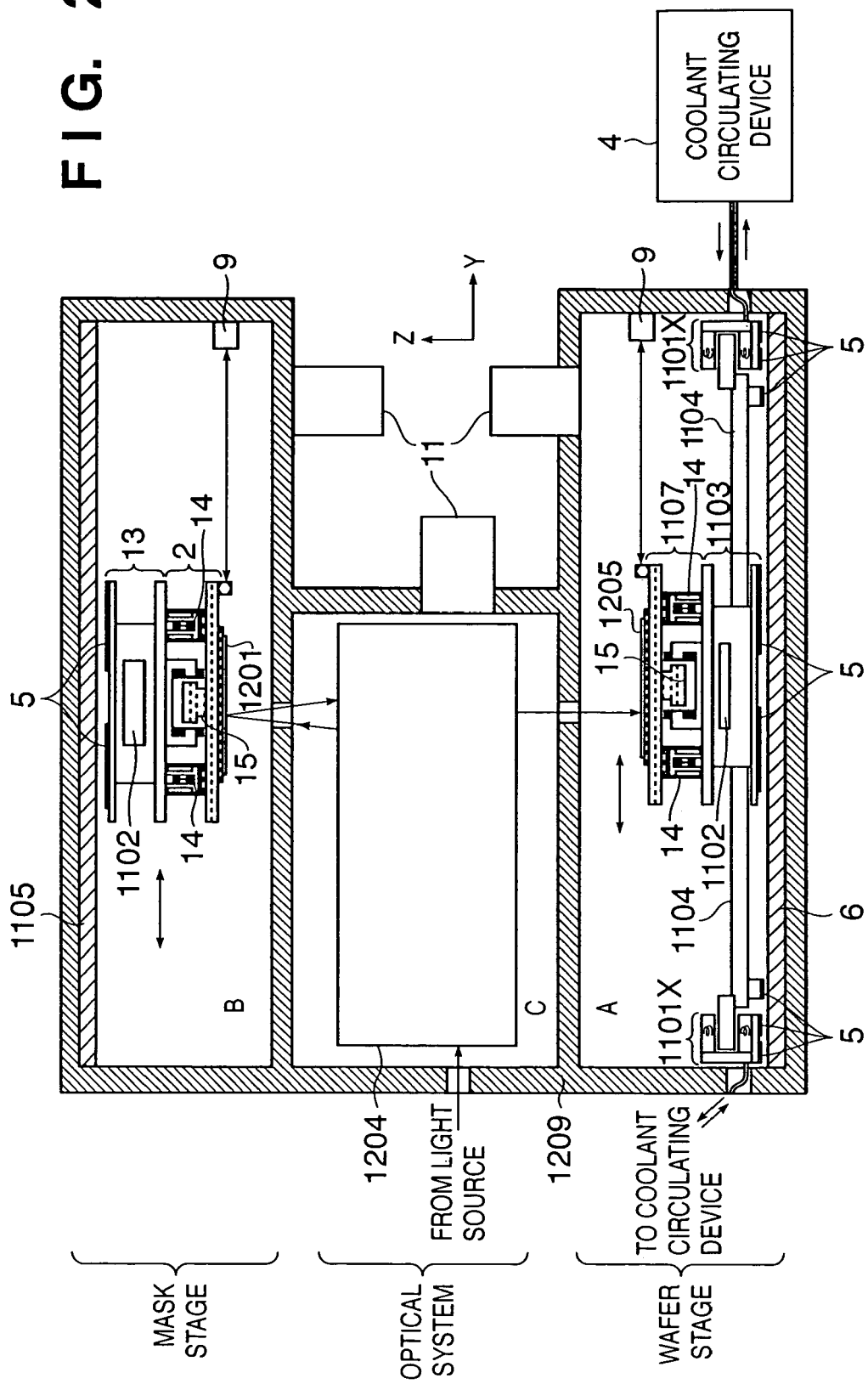

LINEAR MOTOR, STAGE APPARATUS, EXPOSURE APPARATUS, AND DEVICE MANUFACTURING APPARATUS

This is a continuation-in-part application of U.S. patent application Ser. No. 10/347,862 filed on Jan. 22, 2003 now abandoned entitled "LINEAR MOTOR, STAGE APPARATUS, EXPOSURE APPARATUS, AND DEVICE MANUFACTURING APPARATUS", and U.S. patent application Ser. No. 10/674,359 filed on Oct. 1, 2003 now abandoned entitled "EUV EXPOSURE APPARATUS WITH COOLING DEVICE TO PREVENT OVERHEAT OF ELECTROMAGNETIC MOTOR IN VACUUM".

FIELD OF THE INVENTION

The present invention relates to a linear motor, a stage apparatus to which the linear motor is applied, an exposure apparatus, and a device manufacturing method to which the exposure apparatus is applied.

BACKGROUND OF THE INVENTION

FIG. 13 is a sectional view schematically showing the structure of a conventional general moving-magnet linear motor. A movable element 1310 comprises field permanent magnets 1311 and movable element yoke 1312. The movable element yoke 1312 is arranged on the back surfaces of the permanent magnets 1311. The movable element yoke 1312 has a function of transmitting a magnetic flux generated by the field permanent magnet 1311, and a function of supporting the entire movable element 1310. The permanent magnets 1311 are arranged side by side in the moving direction (right-to-left direction on the sheet surface of FIG. 13) of the movable element 1310. A stator 1320 comprises a stator yoke 1321 formed from a laminated iron core with a comb-like tooth structure, and a coil 1323 which is wound around every other iron-core tooth 1322 of the stator yoke 1321 for three-phase driving. Each iron-core tooth 1322 has an I shape, and the I-shaped iron-core teeth 1322 are also arranged in the moving direction of the movable element 1310. The longitudinal direction of each iron-core tooth 1322 is a direction perpendicular to the sheet surface of FIG. 13. A magnetic field is generated by the coil 1323 which is properly energized via wiring (not shown). The interaction between the magnetic field and a magnetic field generated by the permanent magnet 1311 generates a moving force. In FIG. 13, the laminated iron core which constitutes the movable element yoke 1312 is fixed onto a stator base 1324.

A conventional cooling method applied to the above linear motor will be explained with reference to FIGS. 14 to 16. The temperature of the coil 1323 rises due to heat generated by the coil 1323. When the temperature exceeds the heat resistant temperature of the insulating covering of the coil 1323, the insulating covering is torn. As a result, the coil 1323 short-circuits and is damaged. The first purpose of cooling is to prevent the damage to the coil.

The second purpose of cooling is to control the temperature environment of the linear motor applied to a semiconductor manufacturing apparatus, machine tool, and the like which are required to attain a high precision. Even with such a temperature rise as not to short-circuit the coil, heat by the temperature rise of the coil increases the temperature of the whole linear motor. The temperature rise of the linear motor leads to the temperature rise of a structure, moving table, or the like which supports the linear motor, deforming the structure, moving table, or the like. Deformation of various members must be prevented by controlling the temperature environment by cooling.

As disclosed in International Patent Laid-Open No. 10-511837, in the arrangement shown in FIG. 14, the coil 1323 and a cooling pipe 1401 are arranged at a gap (slot) defined by the I-shaped iron-core teeth 1322 of the stator 1320. The cooling pipe 1401 is made of copper or aluminum. Heat generated by the coil 1323 is transferred to the cooling pipe 1401 and absorbed by a coolant 1402 flowing through the cooling pipe 1401. In order to enhance the heat transfer between the cooling pipe 1401 and the coil 1323 and the endothermic effect, the cooling pipe 1401 and coil 1323 are thermally coupled to each other by a sheet (not shown).

Since the cooling pipe 1401 is a conductor, an eddy current is generated by a leakage flux at the slot which is a gap defined by the iron-core teeth 1322. This eddy current degrades linear motor characteristics. To prevent this, the cooling pipe is arranged at the bottom of the slot (i.e., on the stator base).

As disclosed in Japanese Patent Laid-Open No. 10-257750, in the second prior art shown in FIG. 15, the cooling pipe 1401 is arranged outside the stator yoke (laminated iron core) 1321 and coil 1323. In order to prevent degradation of the performance caused by the eddy current, the cooling pipe 1401 is made of a nonmagnetic material. Part of heat generated by the coil 1323 is directly transferred to the cooling pipe 1401 and absorbed by it. The remaining heat is transferred to the stator yoke (laminated iron core) 1321, then transferred to the cooling pipe 1401, and absorbed by the coolant 1402.

In the third prior art shown in FIG. 16, the cooling pipe 1401 is arranged in the stator base 1324. Since neither leakage magnetic flux nor eddy current is generated at this place, a cooling pipe 1401 of a conductor can be adopted. Heat generated by the coil 1323 reaches the stator base 1324 via the stator yoke (laminated iron core) 1321 in contact with the coil 1323, and absorbed by the coolant 1402 in the cooling pipe 1401. Also in this prior art, a sheet or bobbin (not shown) is interposed between the stator yoke 1321 and the coil 1323 so as to efficiently transfer heat to the stator yoke (laminated iron core) 1321.

In the above-mentioned prior arts, the circumferential portion of the coil 1323 is cooled, and no attention is paid to the temperature distribution (e.g., internal temperature) of the coil 1323. The application limit of the linear motor is determined by the temperature of a portion of the coil where the temperature becomes highest. Even if the temperature near the cooling pipe does not reach the application limit temperature of the winding, but the temperature of a portion of the coil where the temperature becomes highest reaches the application limit temperature, the linear motor cannot be used.

The method shown in FIG. 14 is one-side cooling of cooling only the lower portion of the coil 1323. The upper portion (opposite side) is slightly cooled by air, but the temperature of the interior (particular a portion apart from the cooling pipe) becomes higher than the outer temperature. Note that the cooling pipe cannot be arranged at the upper portion owing to the above-mentioned problem of generating an eddy current.

The method shown in FIG. 15 is also one-side cooling though the nonmagnetic pipe is arranged above the stator yoke (laminated iron core) 1321 and coil 1323. The lower portion (opposite side) of the coil 1323 is the slot bottom, and heat generated by the coil 1323 is transferred to the stator yoke (laminated iron core) 1321 and absorbed. However, the internal coil temperature also rises. In this arrangement, the cooling pipe 1401 is interposed between the stator yoke (laminated iron core) 1321 and the permanent magnet of the movable element. The permanent magnet must be spaced apart from the stator yoke (laminated iron core) 1321 by the thickness of the cooling pipe 1401. The magnetic flux density does not become higher, compared to FIG. 14, and the thrust generated upon supplying the same amount of current to the coil 1323 is smaller. If the current is increased to obtain the same thrust, the heat generation amount of the coil 1323 increases by the square of the current, resulting in a very low efficiency. The permanent magnet may be made thick in order to increase the magnetic flux density. However, the movable element becomes heavy and requires a larger thrust for movement. Even if the thrust constant is increased by simply making the permanent magnet thick, the movable element weight increases much more, increasing heat generated by the coil 1323. Thus, the structure of FIG. 15 is not optimal.

In terms of coil cooling, the arrangement shown in FIG. 16 does not directly cool the coil 1323, and has the lowest cooling efficiency of the three prior arts. Heat which cannot be absorbed by the coolant flowing through the stator is dissipated to air around the linear motor. Part of heat is transferred to a surface plate which supports the stator, and deforms the surface plate. This method can cool the coil in air even with a low efficiency. However, heat cannot be dissipated by air in a linear motor used for a recently demanded step & scan projection exposure apparatus which operates in a vacuum environment and uses EUV (Extreme Ultra Violet) light as exposure illumination light, because this linear motor is set in a vacuum environment. All heat must be absorbed via the cooling pipe, but there is a gap between the laminated steel plate of the stator yoke 1321 and the coil 1323. In the vacuum environment, the gap is vacuum and set in a heat-insulated state. Further, the stator yoke (laminated iron core) 1321 and stator base 1324 macroscopically seem to be in contact with each other, but microscopically have a gap between them. In the vacuum environment, the gap is vacuum and set in a heat-insulated state. In this environment, heat of the coil 1323 is hardly transferred to the coolant 1402. That is, the coil 1323 is placed in almost the heat-insulated state in the vacuum environment. It is substantially difficult to supply a current to the coil 1323, and the linear motor does not function. In the vacuum environment, the arrangements shown in FIGS. 14 and 15 also suffer the same problem.

One factor impeding the stage performance of each of the mask stage and the wafer stage is deformation of the structure caused by heat. Even when a wafer support member and a mask support member constituting parts of the respective stages are each formed of a material exhibiting low thermal expansion, such as SiC, the stage performance is potentially affected unless temperature control is performed at an accuracy level of not larger than 0.001° C. Also, when the wafer and the mask are moved at a high acceleration for the purpose of a higher throughput, heat generated by an electromagnetic motor, e.g., a linear motor for driving the stage, gives rise to a problem. If the stage acceleration is doubled, the generated heat is increased four times because it is in proportion to the square of acceleration. The electromagnetic motor for moving the wafer or the mask over a large stroke is responsible for 90% or more of the heat generated in each stage.

As compared with an apparatus for projecting and exposing a mask pattern to a wafer in air or an inert gas, e.g., nitrogen, the EUV exposure apparatus is advantageous in that, because of projecting and exposing a mask pattern to a wafer in a vacuum, the heat generated from coils of the electromagnetic motor is not transmitted to the mask stage or the wafer stage through the air or the inert gas. In the EUV exposure apparatus, if the heat generated from coils of the electromagnetic motor is avoided from being transmitted to apparatus components, such as a surface plate, through members supporting the mask stage or the wafer stage, there is no necessity of preventing the heat generation from the coils of the electromagnetic motor in order to eliminate an adverse effect upon the stage performance.

However, the above-mentioned advantage of the heat generated from the coils of the electromagnetic motor not being transmitted to the mask stage or to the wafer stage because of the employment of a vacuum means, on the other hand, that the heat generated from the coils of the electromagnetic motor will accumulate in the electromagnetic motor itself. Accordingly, there occurs a problem that the coils of the electromagnetic motor may suffer overheat damage from the heat generated by the coils themselves.

SUMMARY OF THE INVENTION

The present invention has been made in consideration of the above situation, and has as an object to increase, e.g., the cooling efficiency of a linear motor.

In another aspect, the present invention has an object to prevent, in a vacuum environment, coils of an electromagnetic motor for driving a stage from being damaged due to heat generated by the coils.

According to the first aspect of the present invention, there is provided a linear motor having a stator and a movable element, comprising a plurality of coil units arrayed in a moving direction of the movable element, and a first coolant channel through which a coolant flows. Each of the plurality of coil units has at least two partial coils divided into a direction different from the moving direction of the movable element. The first coolant channel is so arranged as to run between at least two partial coils which constitute each of the plurality of coil units.

According to a preferred aspect of the present invention, it is preferable that the linear motor further comprise a yoke having a plurality of iron-core teeth corresponding to the respective coil units, and each of the plurality of coil units be divided in a direction of depth of the plurality of iron-core teeth.

According to another preferred aspect of the present invention, a heat transfer substance (e.g., resin) is preferably filled in gaps between the iron-core teeth, the partial coils, and the first coolant channel.

According to still another preferred aspect of the present invention, it is preferable that the linear motor further comprise a wall which surrounds the yoke, and the wall have a structure usable as a vessel which is arranged outside the yoke before hardening the heat transfer substance and used to harden the heat transfer substance.

According to still another preferred aspect of the present invention, the wall comprises a nonmagnetic material portion covering an upper side of the plurality of iron-core teeth, wherein the stator and the movable member are opposed via the nonmagnetic material portion.

According to still another preferred aspect of the present invention, the linear motor preferably further comprises a support which supports the yoke, and a second coolant channel which is formed in the support and used to supply the coolant. The linear motor preferably further comprises a second heat transfer substance (e.g., resin) between the yoke and the support. Moreover, it is preferable that the support have a plurality of contacts in contact with the yoke, and the second heat transfer substance be interposed between the plurality of contacts.

According to still another preferred aspect of the present invention, the first coolant channel is preferably meandered between the plurality of iron-core teeth. It is preferable that the first coolant channel comprise a plurality of straight portions which run between the plurality of iron-core teeth, and a plurality of U-shaped portions which couple the plurality of straight portions to form a continuous channel, the plurality of U-shaped portions be alternately arranged on right and left sides, and the plurality of straight portions and the plurality of U-shaped portions constitute a structure in which the first coolant channel is meandered between the plurality of iron-core teeth.

According to still another preferred aspect of the present invention, an extraction line of each of the plurality of coils is preferably extracted between one U-shaped portion and an adjacent U-shaped portion. The extraction line of each of the plurality of coils is preferably extracted from one of two sides of the yoke.

According to still another preferred aspect of the present invention, it is preferable that the structure in which the first coolant channel is meandered between the plurality of iron-core teeth have first and second ends, the first coolant channel further comprise a second straight portion which is coupled to the first end and extends from the first end to the second end, the second straight portion be arranged along the other side of the two sides of the yoke, and an inlet and an outlet of the first coolant channel be arranged at one of two ends of the yoke in a longitudinal direction.

According to still another preferred aspect of the present invention, an inlet and an outlet of the first coolant channel are preferably arranged at one of two ends of the yoke in a longitudinal direction.

According to still another preferred aspect of the present invention, the first coolant channel is preferably divided into a plurality of blocks.

According to still another preferred aspect of the present invention, the first coolant channel preferably comprises a plurality of first straight portions which run between the plurality of iron-core teeth, a second straight portion which is coupled to the plurality of first straight portions on one of two sides of the yoke, and a third straight portion which is coupled to the plurality of first straight portions on the other side of the two sides of the yoke. The plurality of first straight portions are preferably smaller in sectional area than the second and third straight portions. A sum of sectional areas of the plurality of first straight portions is preferably substantially equal to a sectional area of each of the second and third straight portions.

According to still another preferred aspect of the present invention, the first coolant channel is preferably formed from copper or stainless steel.

According to still another preferred aspect of the present invention, it is preferable that the first coolant channel include a pipe formed from copper or stainless steel, and a portion of the first coolant channel that is exposed outside a wall be electropolished.

The linear motor of the present invention can be applied to a structure in which the stator out of the stator and the movable element includes the plurality of coil units, the yoke, and the first coolant channel.

The linear motor of the present invention can also be applied to a structure in which the movable element out of the stator and the movable element includes the plurality of coil units, the yoke, and the first coolant channel.

According to the second aspect of the present invention, there is provided a stage apparatus to which the above-described linear motor is applied, comprising the linear motor, and a stage which is driven by a movable element of the linear motor.

According to the third aspect of the present invention, there is provided an exposure apparatus to which the above-described stage apparatus is applied, comprising the stage apparatus as at least either of a master stage and a substrate stage. The exposure apparatus may be, e.g., a scanning exposure apparatus, a step & scan exposure apparatus, or another exposure apparatus.

According to the fourth aspect of the present invention, there is provided a device manufacturing method to which the above-described exposure apparatus is applied, comprising the steps of exposing a substrate to a pattern by the exposure apparatus, and developing the exposed substrate.

According to the fifth aspect of the present invention, there is provided a device manufacturing method comprising the steps of installing a plurality of semiconductor manufacturing apparatuses including the above-described exposure apparatus in a factory, and manufacturing a semiconductor device by using the plurality of semiconductor manufacturing apparatuses.

According to still another preferred aspect of the present invention, the device manufacturing method preferably further comprises the steps of connecting the plurality of semiconductor manufacturing apparatuses by a local area network, connecting the local area network and an external network outside the factory, acquiring information about the exposure apparatus from a database on the external network by using the local area network and the external network, and controlling the exposure apparatus on the basis of the acquired information.

According to the sixth aspect of the present invention, there is provided a semiconductor manufacturing factory comprising a plurality of semiconductor manufacturing apparatuses including the above-described exposure apparatus, a local area network which connects the plurality of semiconductor manufacturing apparatuses, and a gateway which connects the local area network and an external network outside the semiconductor manufacturing factory.

According to the seventh aspect of the present invention, there is provided an exposure apparatus maintenance method comprising the steps of preparing a database for accumulating information about maintenance of the above-described exposure apparatus on an external network outside a factory where the exposure apparatus is installed, connecting the exposure apparatus to a local area network in the factory, and maintaining the exposure apparatus on the basis of the information accumulated in the database by using the external network and the local area network.

According to the eighth aspect of the present invention, there is provided an EUV exposure apparatus for exposing a pattern of an original plate on an original plate stage to a substrate on a substrate stage in a vacuum environment, the apparatus comprising an electromagnetic motor driving at least one of the original plate stage and the substrate stage, and cooling means for cooling the electromagnetic motor an amount sufficient to prevent overheat damage of the electromagnetic motor resulting from heat generated by the electromagnetic motor.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 19 is a view showing a user interface on the display;

FIG. 22 is a view showing the concept of another EUV scanning projection exposure apparatus;

DETAILED DESCRIPTION OF THE PREFERRED EMBODIMENTS

A linear motor according to the present invention is preferable as an actuator in an exposure apparatus, precision processing apparatus, and precision measurement apparatus used to manufacture devices such as a semiconductor device and liquid crystal display device. As for the exposure apparatus, the linear motor according to the present invention can be applied to any one of a scanning exposure apparatus, step & repeat exposure apparatus, and step & scan exposure apparatus.

The division structure of a coil unit in the linear motor of the present invention is suitable for, e.g., both a moving-magnet linear motor and moving-coil linear motor. That is, the linear motor of the present invention is suitable for an arrangement in which each coil unit of a stator is divided into a plurality of partial coils and a coolant channel (e.g., cooing pipe) is formed in the divided partial coil pipe, and an arrangement in which each coil unit of a movable element is divided into a plurality of partial coils and a coolant channel (e.g., cooing pipe) is formed in the divided partial coil pipe.

Preferred embodiments of the present invention will be described below with reference to the accompanying drawings.

Figure 1:
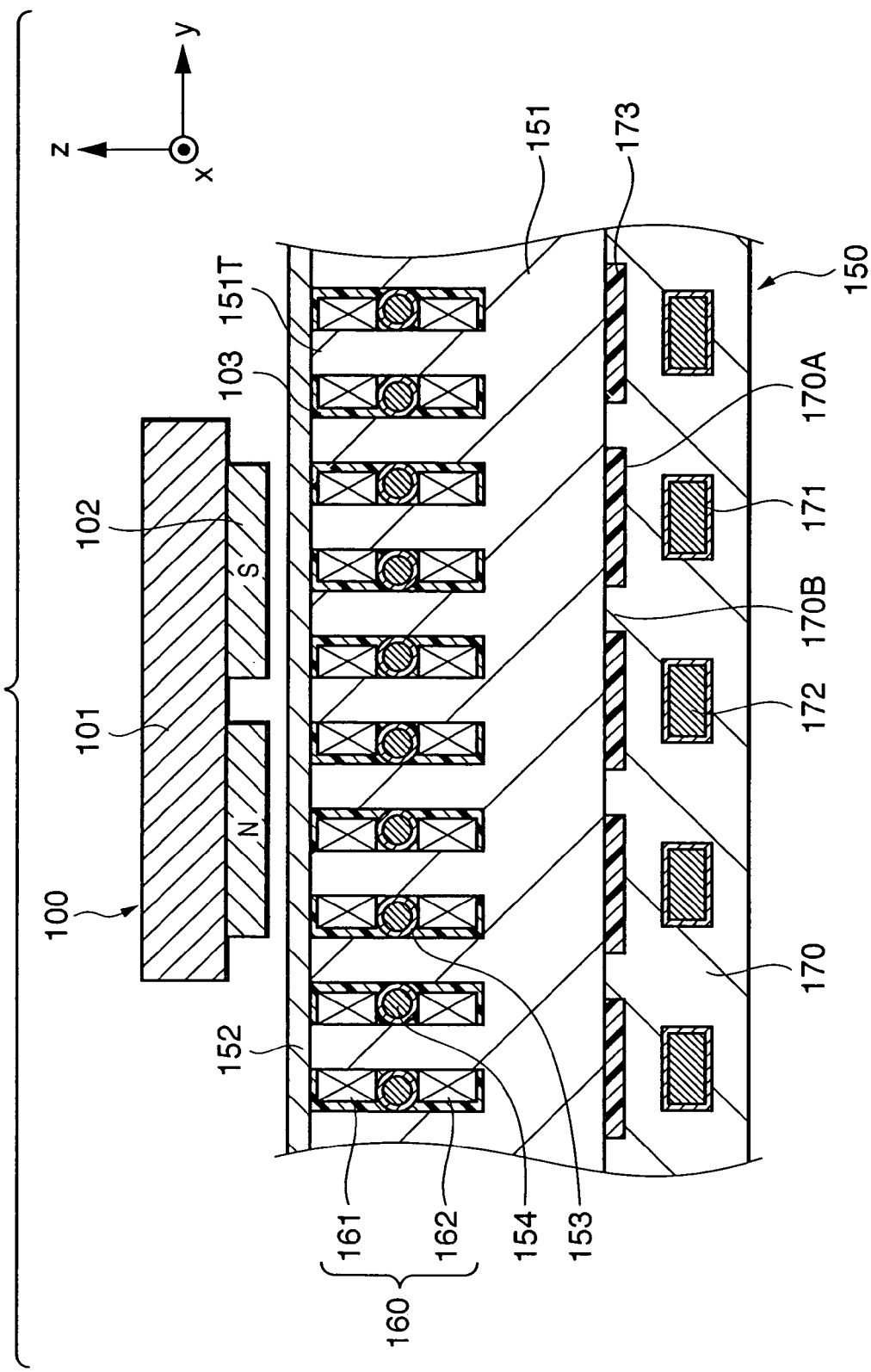
FIG. 1 is a sectional view schematically showing the structure of a moving-magnet linear motor according to a preferred embodiment of the present invention.
Figure 2:
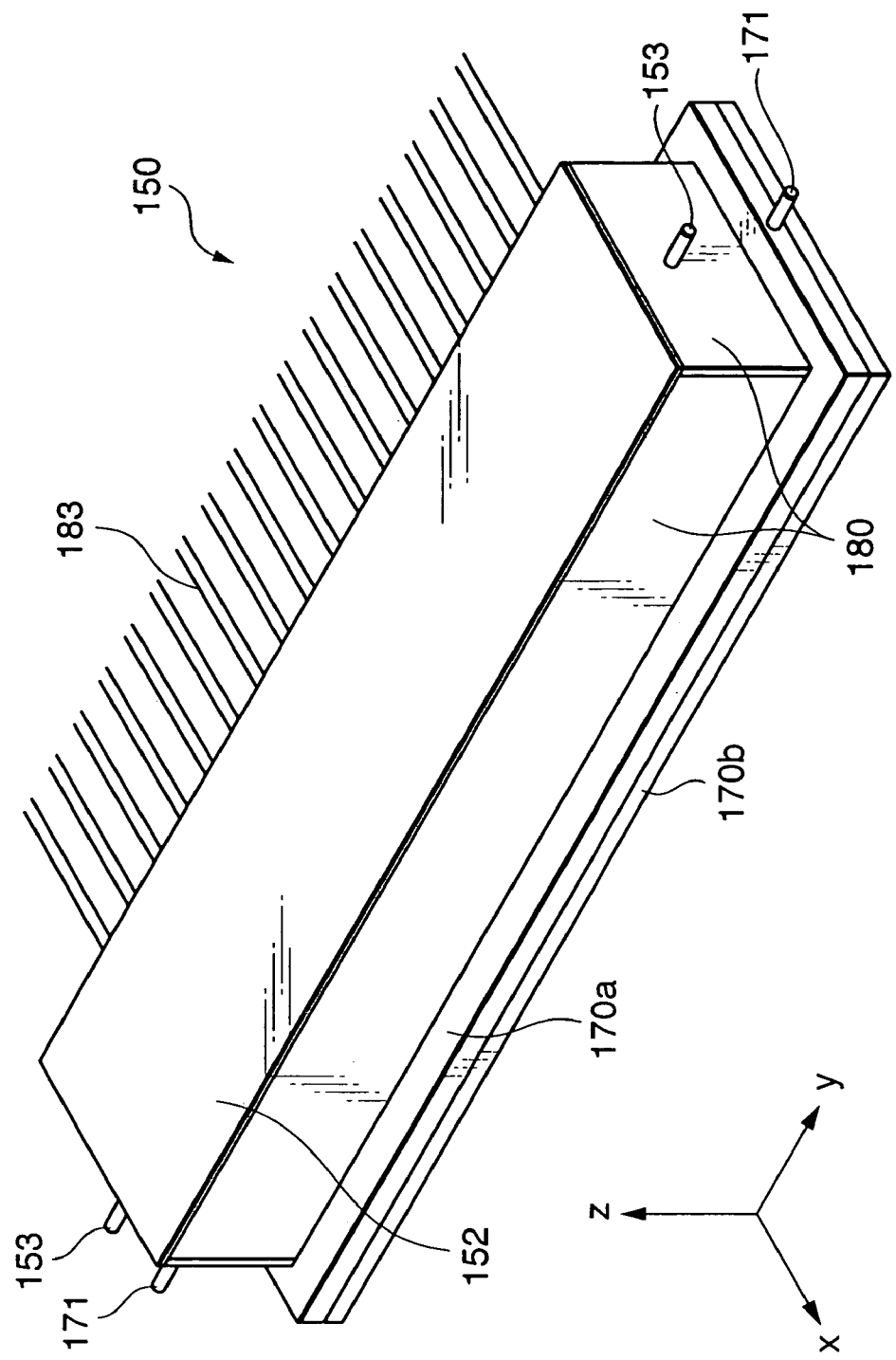
FIG. 2 is a perspective view showing the outer appearance of the linear motor shown in FIG. 1 on the stator side.

FIG. 1 is a sectional view schematically showing the structure of a moving-magnet linear motor according to a preferred embodiment of the present invention. FIG. 2 is a perspective view showing the outer appearance of the linear motor shown in FIG. 1 on a stator 150 side. A movable element 100 shown in FIG. 1 comprises field permanent magnets 102 and a movable element yoke 101. The permanent magnets 102 are made of a high-rigidity material, and arranged side by side in the moving direction (i.e., y direction) of the movable element 100. The material of the movable element yoke 101 is iron, silicon steel, or the like. The movable element yoke 101 has a function of transmitting a magnetic flux generated by the permanent magnet 102, and a function of supporting the permanent magnet 102.

When the linear motor is assembled into, e.g., a stage apparatus, the back surface of the movable element yoke 101 is preferably supported by a ceramic member in order to reduce the mass of the movable portion and increase the rigidity. The movable element yoke 101 suffices to ensure a minimum thickness necessary to form a flux path.

The stator 150 comprises a stator yoke 151 with a plurality of projections that form the cores of coil units 160 along the moving direction of the movable element 100. The projections of the stator yoke 151 are made of a laminated iron core with a comb-tooth shape. For three-phase driving, each coil unit 160 made up of a pair of upper and lower partial coils 161 and 162 is held by, attached to, fixed to, or wound around (to be referred to as "wound around" hereinafter) every other projection member (to be referred to as an "iron-core tooth" hereinafter) serving as an iron-core tooth 151T of the stator yoke 151. The longitudinal direction of the slot between adjacent iron-core teeth 151T is a direction (X direction) perpendicular to the sheet surface of FIG. 1. Each coil unit 160 is properly energized via a coil extraction line 183 to generate a magnetic field. The interaction between the magnetic field generated by the coil 160 and a magnetic field generated by the permanent magnet 102 generates a driving force for driving the movable element 100.

The coil unit 160 is divided into the upper partial coil (to be also referred to as an upper coil hereinafter) 161 and the lower partial coil (to be also referred to as a lower coil hereinafter) 162. The upper and lower coils 161 and 162 form a double coil, and are continuously covered with a winding. More specifically, the conductor at the winding end of the lower coil 162 is connected to the conductor at the winding start of the upper coil 161. The winding directions of the two partial coils 161 and 162 are the same. A first cooling pipe (coolant channel) 153 is interposed between the upper and lower coils 161 and 162. The material of the first cooling pipe 153 is preferably a high-thermal-conductivity material such as copper or stainless steel in order to increase the heat transfer efficiency from the outside to the inside. A coolant 154 is preferably an inert substance with a large specific heat and low viscosity. For example, a refrigerant used in a general refrigerator or deaerated pure water can be adopted.

Figure 14:
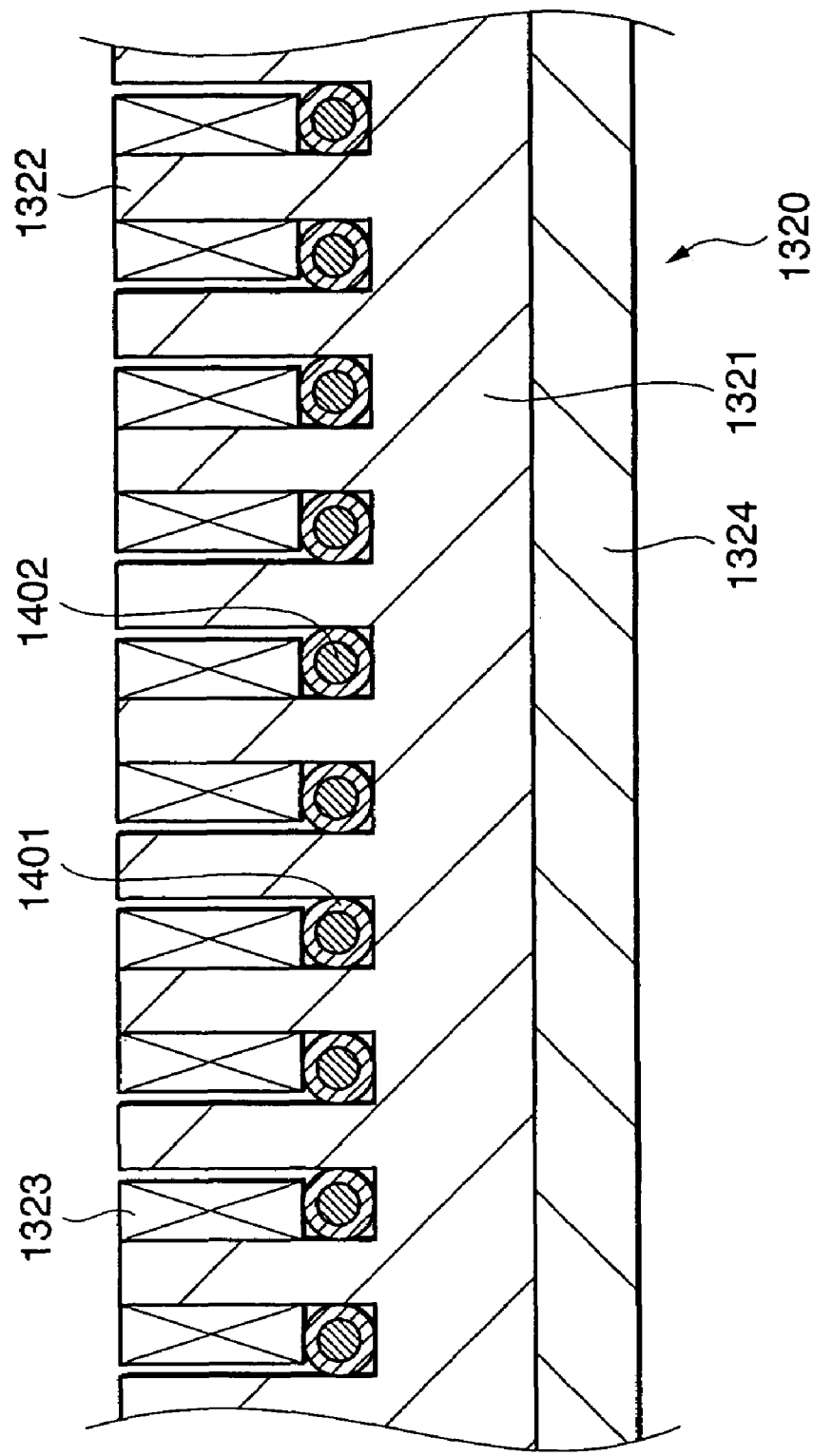
FIG. 14 is a sectional view showing the arrangement of another conventional linear motor.
Figure 15:
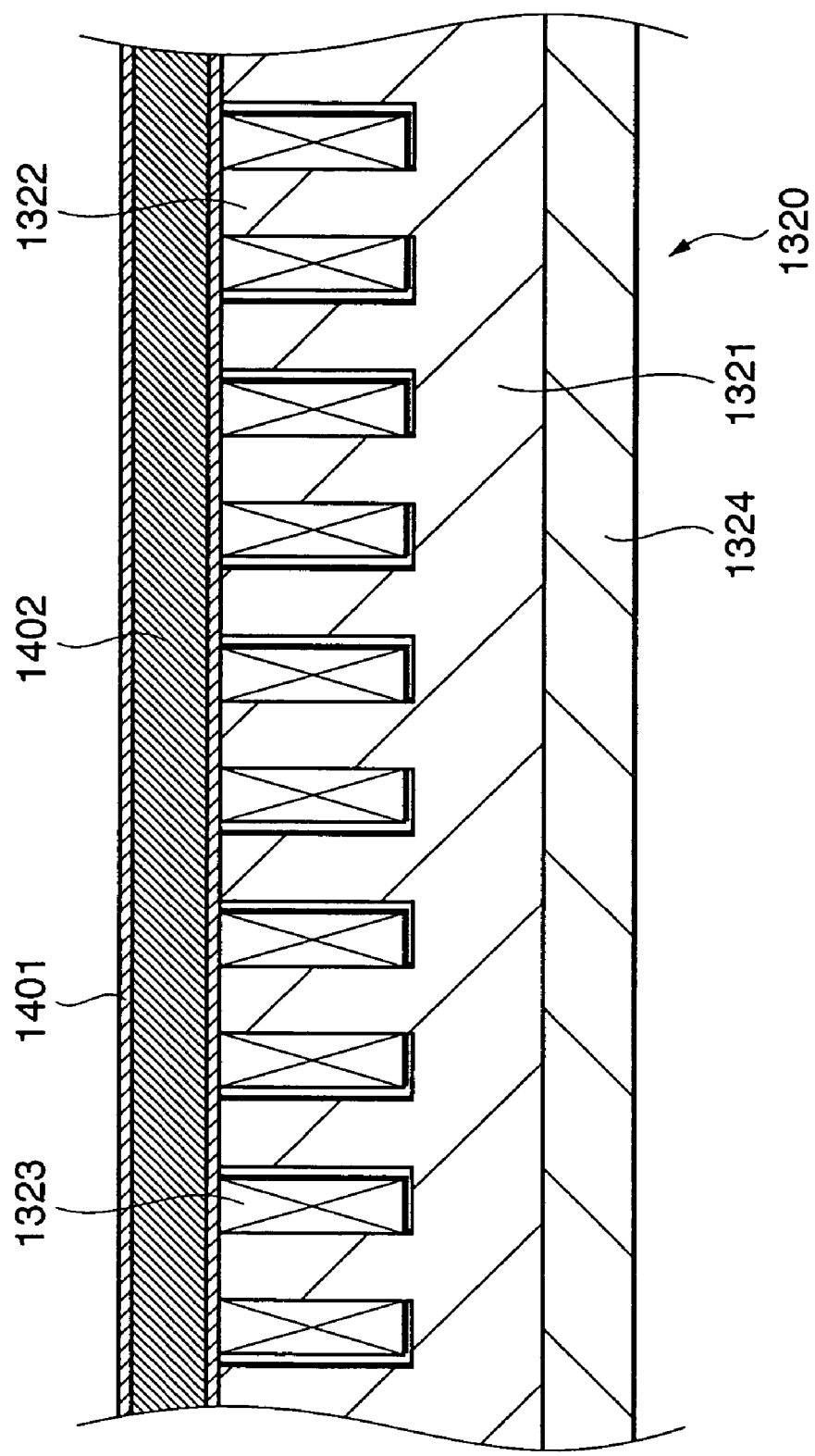
FIG. 15 is a sectional view showing the arrangement of still another conventional linear motor.
Figure 16:
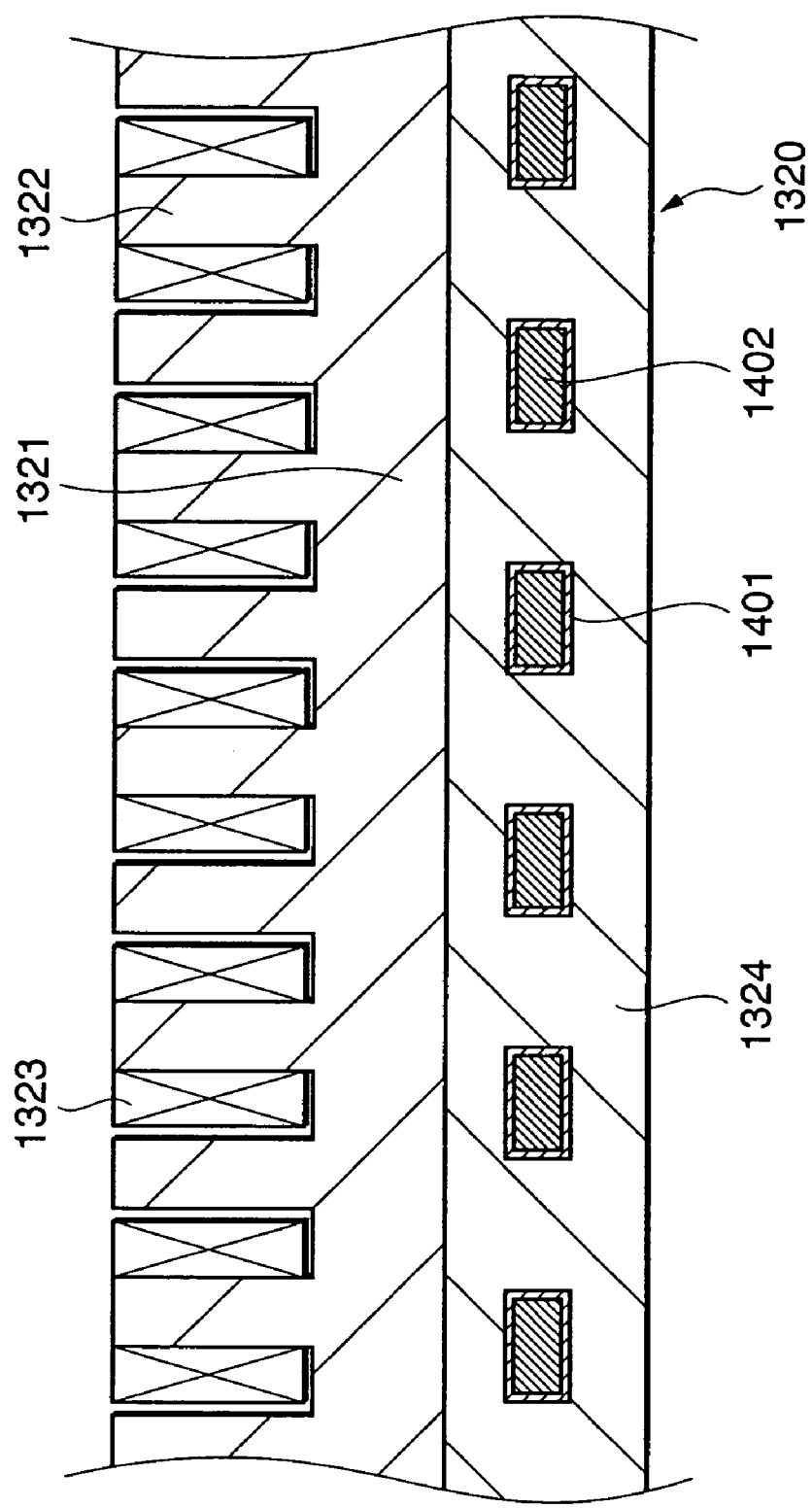
FIG. 16 is a sectional view showing the arrangement of still another conventional linear motor.

In the prior arts shown in FIGS. 14 and 15, the cooling pipe is arranged on only one side of the coil. The temperature rises on an opposite side to the cooling pipe (particularly in the vacuum environment) or inside the coil (particularly in the outer air environment).

To the contrary, in the preferred embodiment of the present invention, the coil unit 160 is divided into two coils, and the first cooling pipe 153 is interposed between these coils. This structure can effectively cool the interior of the coil where the temperature readily rises in the use of a conventional linear motor in the outer air environment, and a portion (e.g., the upper portion of the coil when the cooling pipe is arranged below the coil) where the temperature readily rises in the use of a conventional linear motor in the vacuum environment.

That is, the whole coil unit can be effectively cooled by dividing the coil unit into a plurality of partial coils and arranging the cooling pipe between the divided partial coils.

In the prior art, the laminated steel plate (laminated iron core) which constitutes the stator yoke 1321 is arranged on one side of the cooling pipe 1401 (in FIG. 14, at the lower portion of the cooling pipe 1401). The coil cannot be directly cooled on one side of the cooling pipe. In other words, in the prior art, one side of the cooling pipe 1401 merely indirectly absorbs heat transferred from the coil 1323 to the laminated iron core, resulting in a low cooling efficiency.

According to the preferred embodiment of the present invention, the upper and lower portions of the cooling pipe 153 face the partial coils 161 and 162. The cooling pipe 153 can directly absorb heat from the partial coils 161 and 162 at the upper and lower portions. Heat from the partial coils 161 and 162 can be efficiently absorbed.

In terms of the thermal conductivity, the cooling pipe 153 is preferably made of a conductor. However, if the leakage magnetic flux exists at a slot as a gap between adjacent iron-core teeth 151T in the use of the conductor, the leakage magnetic flux generates an eddy current. In the arrangement of this embodiment, the cooling pipe 153 is arranged at the center of the slot, and the influence of the eddy current is reduced to a negligible degree in practical use. That is, the linear motor of this embodiment satisfies both an increase in cooling efficiency and reduction of the influence of the leakage current.

The coil unit 160 is divided into two coils in the example shown in FIG. 1. Alternatively, a triple coil and two cooling pipes inserted into it may be used to divide the coil unit 160 into three coils. The coil unit 160 can also be divided into a larger number of coils. In this case, the iron-core tooth becomes longer by the length of the cooling pipe. The rigidity of the stator decreases, and the entire linear motor becomes higher. The division number should, therefore, be determined in accordance with specifications required for the stage apparatus to which the linear motor is applied.

A resin 103 is preferably filled into the gaps between the cooling pipe 153 and the partial coils 161 and 162 which constitute the coil unit 160 in order to efficiently transfer heat generated by the coil unit 160 to the cooling pipe 153. It is preferable to perfectly fill the resin 103 into gaps including gaps between wires which constitute the coils 161 and 162. To realize perfect filling, it is preferable to sufficiently deaerate the resin 103 before hardening. If air remains in the resin 103 owing to insufficient deaeration, a void thermally acts as a heat insulator, decreasing the heat transfer efficiency and cooling efficiency. To perfectly fill the resin 103, the viscosity is preferably low before hardening. Preferable examples of this resin are an epoxy adhesive and acrylic adhesive. An adhesive used as the resin can fill gaps and fix the coil 160 and cooling pipe 153.

The resin 103 may be filled after the coils 161 and 162 and the cooling pipe 153 are assembled into the stator yoke (laminated iron core) 151. Alternatively, the resin may be filled into gaps inside the coils 161 and 162 by vacuum impregnation in a coil before assembly.

To fill the resin 103, a vessel (e.g., mold) for hardening the resin is required. In general, this vessel is removed after resin hardening. In the use of the linear motor in the vacuum environment or a reduced-pressure atmosphere such as He, outgassing from the resin 103 poses a problem. To prevent this, a partition 152 is preferably interposed between the resin 103 and the external environment. The partition 152 also functions as a vessel used to harden the resin 103. In the example shown in FIG. 1, the nonmagnetic partition 152 is arranged as one of such partitions above the stator yoke (laminated iron core) 151. As shown in FIG. 2, partitions 180 are arranged on the sides of the stator yoke (laminated iron core) 151 so as to completely surround the stator yoke (laminated iron core) 151, coil 160, and cooling pipe 153. When the cooling pipe 153 is partially exposed outside the partition 180, the exposed portion is preferably electropolished.

The side partition 180 is preferably made of a material such as ceramic, copper, stainless steel, or aluminum which hardly outgases in the vacuum environment or the reduced-pressure atmosphere such as He. The partition 152 arranged on the surface of the stator yoke (laminated iron core) 151, i.e., the surface facing the field permanent magnet 102 should be made of a nonmagnetic material such as ceramic because a magnetic substance adopted as a partition material generates an eddy current and degrades the performance.

Considering the linear motor efficiency, a thick nonmagnetic partition 152 is not preferable, unlike the prior art shown in FIG. 15, and the thickness of the partition 152 is preferably 1 mm or less. Since a thin ceramic plate with a thickness of 1 mm is expensive, a resin plate made of Teflon® or PEEK which hardly outgases may be used instead of the thin ceramic plate.

The coil unit 160 is wound around the iron-core tooth 151T. Not all heat generated by the coil unit 160 is transferred to the first cooling pipe 153, but part of heat is transferred to the stator yoke (laminated iron core) 151 to increase the temperature of the stator yoke (laminated iron core) 151. From this, the stator yoke (laminated iron core) 151 is also preferably cooled. The stator yoke 151 can be cooled by cooling a stator base 170 for fixing the stator yoke 151. In this embodiment, a second cooling pipe 171 is arranged in the stator base 170 in order to cool the stator base 170 and stator yoke 151.

The stator yoke 151 (laminated iron core) can also be directly cooled. However, the stator yoke 151 is preferably cooled via the stator base 170, as described above. This is because, if a hole is formed in the laminated iron core and a coolant is supplied to the hole, the coolant leaks outside via laminated steel plates. To prevent this leakage, a cooling pipe may be arranged inside the laminated iron core. This method requires work of connecting the pipe to a coolant supply pipe in a direction perpendicular to the sheet surface of FIG. 1 after arranging the cooling pipe in the laminated iron core. This work is not efficient or reliable.

The stator yoke (laminated iron core) 151 and stator base 170 macroscopically seem to be in contact with each other, but microscopically have a gap between them. This gap acts as a heat resistance. As described above, the gap cuts off heat because there is no air at the gap in the vacuum environment or the reduced-pressure atmosphere such as He. Hence, a resin layer 173 is preferably interposed between the stator yoke (laminated iron core) 151 and the stator base 170, similar to the resin 103 used to efficiently transfer heat generated by the coil unit 160 to the cooling pipe 153.

The resin layer 173 may be arranged on the entire lower surface of the stator yoke (laminated iron core) 151. It is more preferable to form in the upper surface of the stator base 170 a groove 170A and contact 170B for arranging the resin layer 173 and manage the level of the contact surface between the stator yoke (laminated steel plate) 151 and the stator base 170 by the contact 170B, as shown in FIG. 1, in order to manage the gap between the stator yoke (laminated iron core) 151 and the field permanent magnet 102 of the movable element 100. As the materials of the resin layer 173 and a coolant 172 supplied to the second cooling pipe 171, e.g., the same materials as those of the resin 103 and coolant 154 for the first cooling pipe 153 can be employed.

Figure 5:
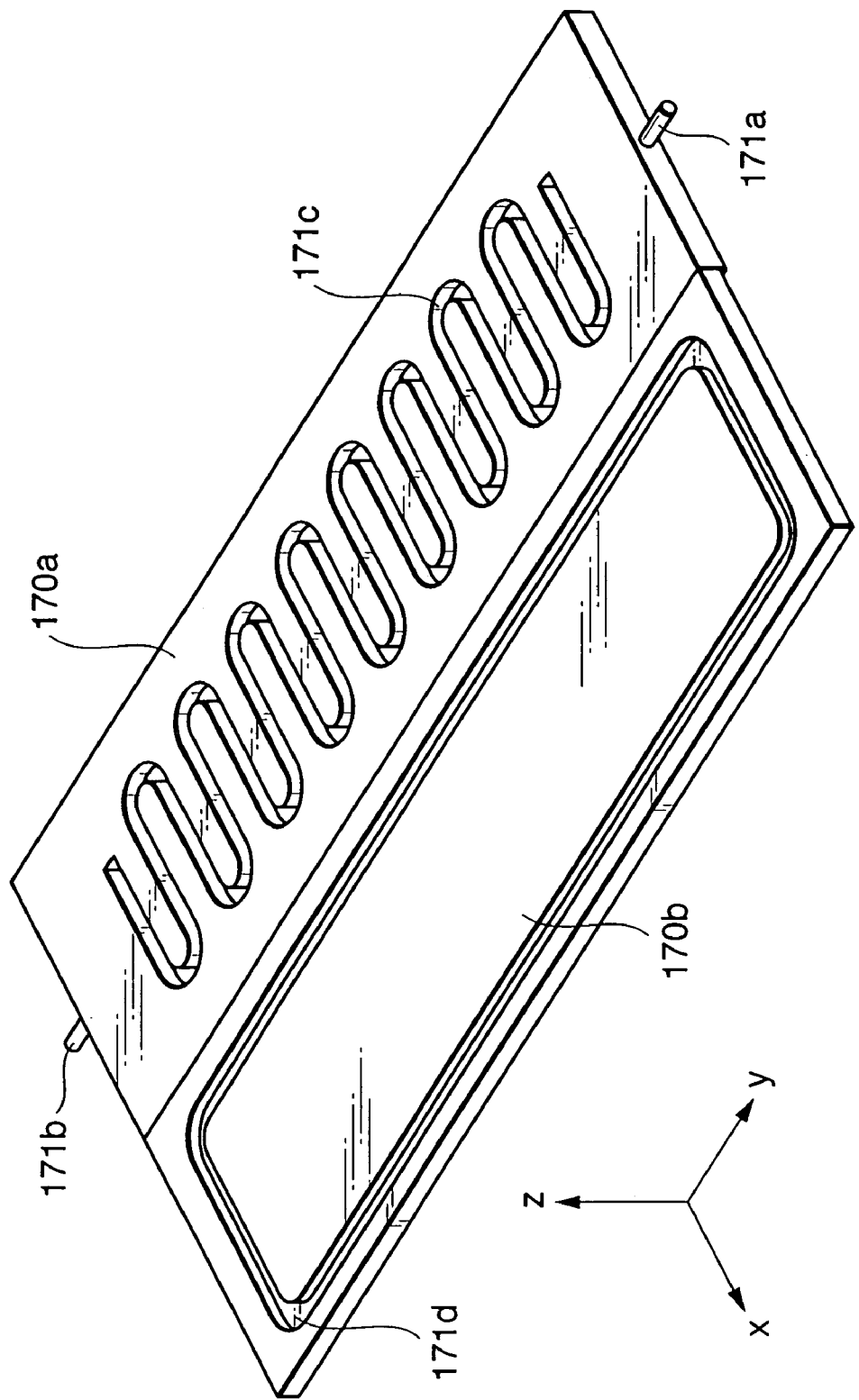
FIG. 5 is a perspective view showing the arrangement of the second cooling pipe in a stator base.

An arrangement of the second cooling pipe 171 will be explained with reference to FIG. 5. In order to arrange the second cooling pipe 171 in the stator base 170, the stator base 170 is divided into upper and lower stator bases 170a and 170b in this embodiment. In FIG. 5, the upper stator base 170a is rotated through 180° about the Y-axis. The upper stator base 170a is further rotated through 180° about the Y-axis and superimposed on the lower stator base 170b, constituting the stator base 170.

The second cooling pipe 171 (second cooling pipe groove 171c) is formed in the upper stator base 170a. A seal member (e.g., O-ring) for preventing external leakage of the coolant is arranged on the lower stator base 170b.

The seal member (O-ring) (not shown in FIG. 5) is actually attached to a seal groove 171d. The seal groove 171d is so arranged as to surround the path of the second cooling pipe groove 171c which constitutes the second pipe 171. The seal groove 171d may be formed in the upper stator base 170a. In this case, interference between the paths of a second cooling pipe inlet 171a and second pipe outlet 171b and the path of the seal groove must be prevented, and the upper stator base 170a must be made thick. From this, the second cooling pipe 171 is preferably formed in the lower stator base 170b.

In the arrangement shown in FIG. 5, the second cooling pipe groove 171c is meandered. Instead of this arrangement, a plurality of straight pipes (grooves) may be arranged side by side, the same arrangement as the first cooling pipe 153 whose detailed arrangement will be exemplified below may be adopted, or another proper arrangement can also be employed.

An outer arrangement of the linear motor on the stator side will be explained with reference to FIG. 2. As described above, the stator 150 of the linear motor is surrounded by the partitions 152 and 180 which have both the function of a vessel used to harden the resin 103 and the function of preventing outgassing. Four partitions 180 which constitute the side portions of the stator 150 and one partition 152 which constitutes its upper portion seal the interior so as not to expose the resin 103 outside. The partition 152 on the surface facing the permanent magnet 102 of the movable element 100 is typically made of a nonmagnetic material, as described above. The partition 152 should be made of a nonmagnetic material at a portion within at least 10 mm (distance in the X-Y plane) from the permanent magnet 102 of the movable element 100. When the x width of the nonmagnetic partition 152 is almost equal to the x width of the permanent magnet 102 of the movable element 100, the partition 180 which constitutes the side portion of the stator 150 should also be made of a nonmagnetic material.

In FIG. 2, the ports (inlet and outlet) of the first and second cooling pipes 153 and 171 are seen from the two ends of the stator 150. Of two ports of each cooling pipe, one is an inlet for supplying a coolant, and the other is an outlet for discharging the coolant.

The extraction line of the coil 160 extends from the Y-Z plane of the stator 150. The extraction line is connected to a motor driver (not shown). When this embodiment is applied to a three-phase linear motor, one coil 160 is connected to a corresponding driving line out of driving lines of three phases U, V, and W of the motor driver (not shown). The next (adjacent) coil 160 is connected to the next driving line of another phase. In this manner, a plurality of coils 160 arrayed in the moving direction (i.e., Y direction) of the movable element 100 are connected to corresponding driving lines out of driving lines of the three phases U, V, and W.

Figure 3:
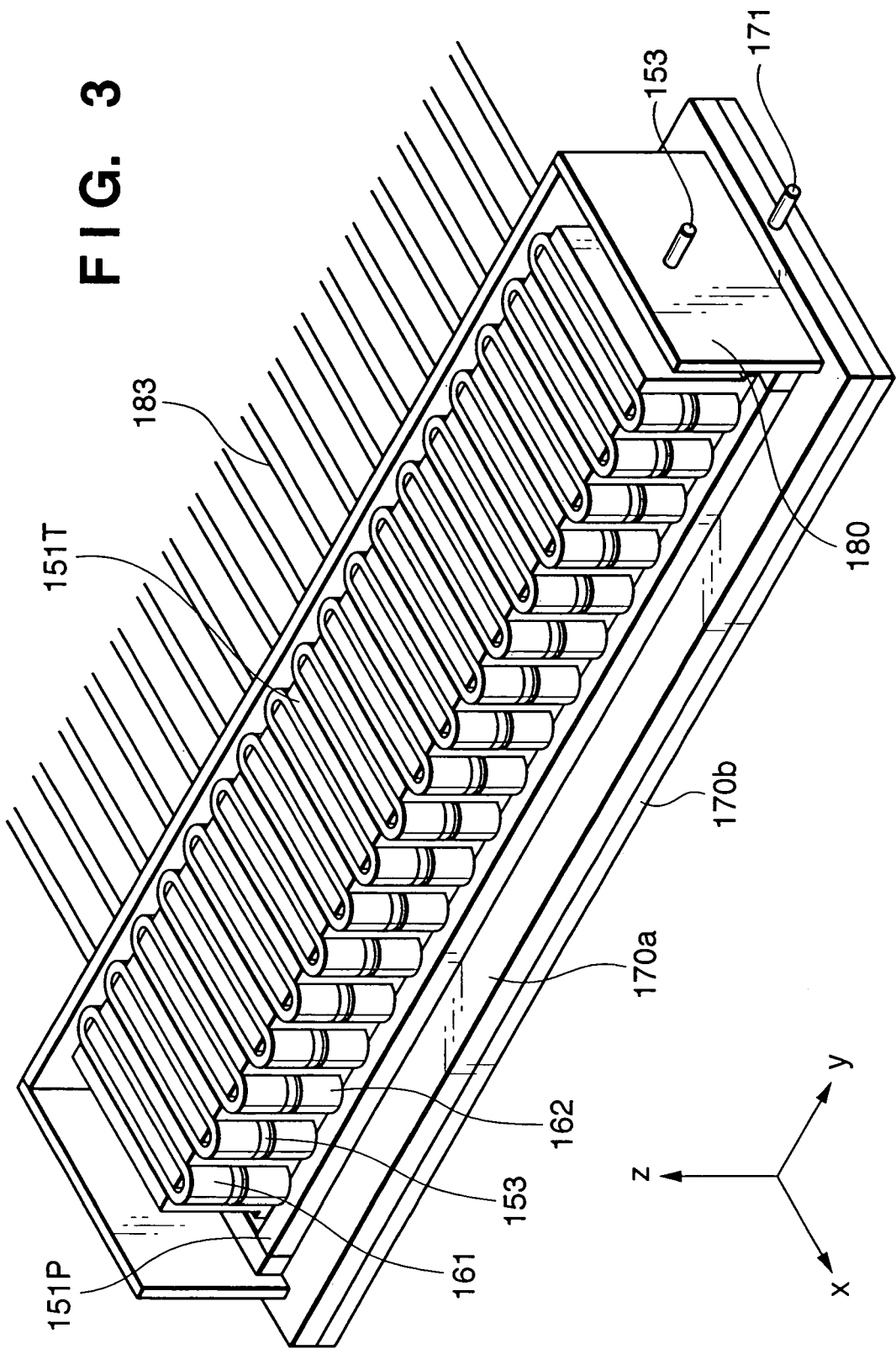
FIG. 3 is a perspective view showing a state in which some of partitions and a filling resin are removed from the stator shown in FIG. 2.

FIG. 3 shows a state in which some of the partitions and the filling resin 103 are removed from the stator 150 shown in FIG. 2. As also shown in FIG. 1, the upper and lower coils 161 and 162 which constitute the coil 160 are so arranged as to sandwich the first cooling pipe 153 from above and below it. The I-shaped iron-core teeth 151T, every other one of which is wound with the coil unit 160 (161 and 162), are arrayed in the moving direction (i.e., Y direction) of the movable element 100. In this embodiment, the coil unit 160 is wound around every other iron-core tooth 151T. Instead of this, coil units can be wound around all the iron-core teeth. To reduce a current for generating the same thrust and reduce heat generation, the number of turns of the coil arranged in each slot must be increased. If two coils are arranged in one slot in the moving direction of the movable element 100, the number of turns per phase decreases because of the necessity of a gap between coil units in assembly. Hence, the arrangement as shown in FIG. 3 is thermally superior.

The relationship between the pole of the permanent magnet 102 of the movable element 100 and the phase of the coil unit 160 is not limited to this embodiment. The same cooling method can also be employed for a different ratio of the pole and phase. The shape of the iron-core tooth is not limited to the I shape and may be, e.g., a T shape.

This embodiment uses an alignment block 151P which aligns the stator base 170 and stator yoke (laminated iron core) 151 in order to make the positional relationship within the X-Y plane between the stator base 170 (170a and 170b), the stator yoke (laminated iron core) 151, and the permanent magnet 102 of the movable element 100 fall within a predetermined precision. A parallel pin is generally used for alignment, but the alignment block 151P in this embodiment also serves as an attaching portion which fixes a partition and thus has a block shape.

Figure 4:
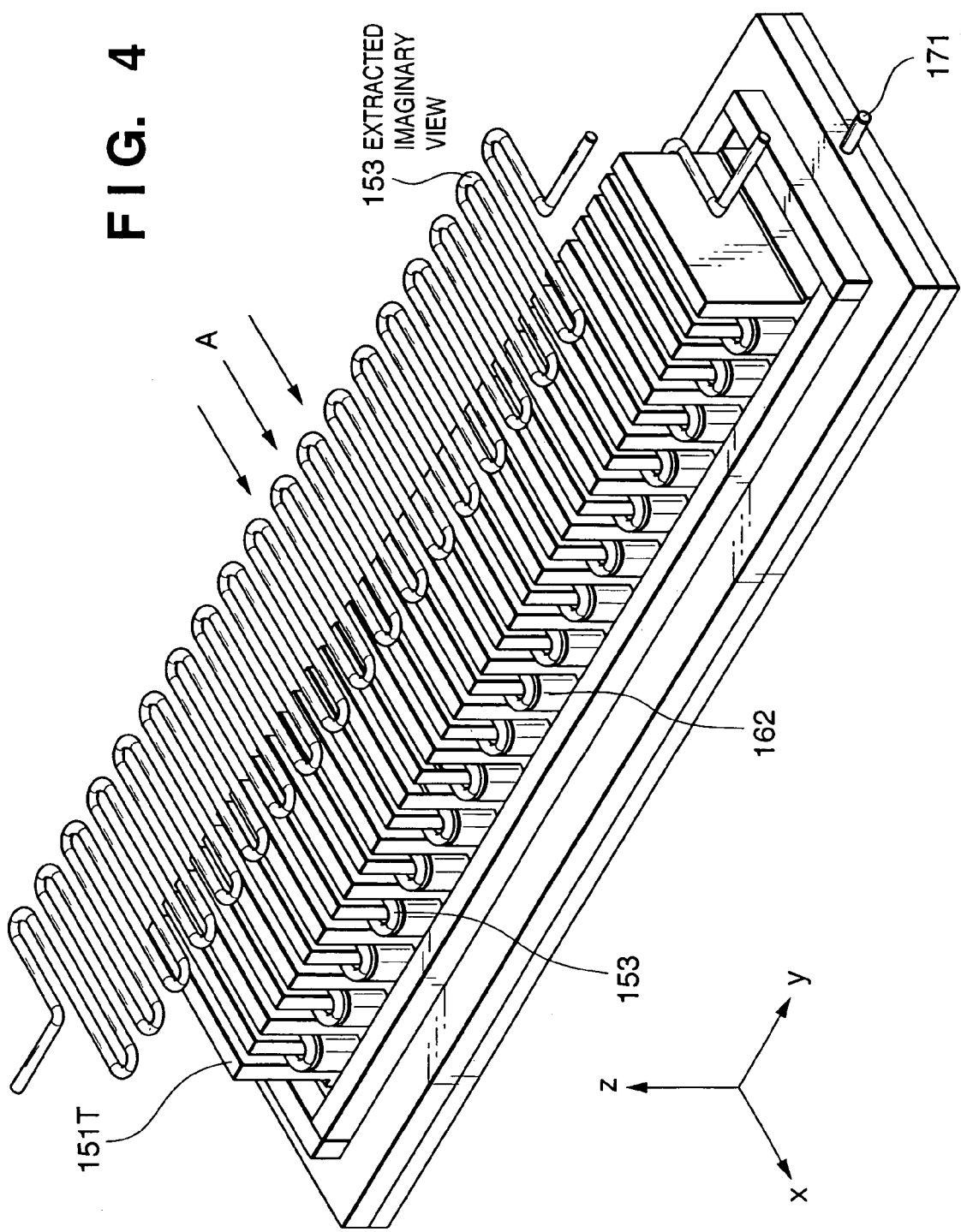
FIG. 4 is a perspective view showing a state in which partitions and an upper coil are removed from the stator of the linear motor shown in FIG. 3.

This embodiment will be kept described with reference to FIG. 4. FIG. 4 is a perspective view showing a state in which the partition 180 and upper coil 161 are removed from the stator of the linear motor shown in FIG. 3. FIG. 4 also illustrates an imaginary view of the extracted first cooling pipe 153.

The first cooling pipe 153 has a structure in which straight pipes (straight portions) running through respective slots are coupled by U-shaped pipes (U-shaped portions), i.e., has a meandered structure as a whole. In this embodiment, the extraction line 183 of the coil 160 (161 and 162) extends from a place indicated by the arrow A, i.e., a place (place without any U-shaped pipe) between a U-shaped pipe and the next U-shaped pipe. In the stator of this embodiment, the coil wiring line (coil extraction line 183) and cooling pipe 153 do not interfere with each other. A conductor which connects the upper and lower coils 161 and 162 also runs through this portion. With this arrangement, the coil wiring line does not cross the cooling pipe 153, and no short circuit occurs between the coil wiring line and the cooling pipe 153. In the prior art, the coil wiring line and cooling pipe are insulated by adhering an insulating sheet after assembly of the cooling pipe, resulting in poor workability. However, this embodiment can eliminate insulating sheet adhering work for preventing any short circuit, and can realize a simple arrangement and low work cost.

Figure 6:
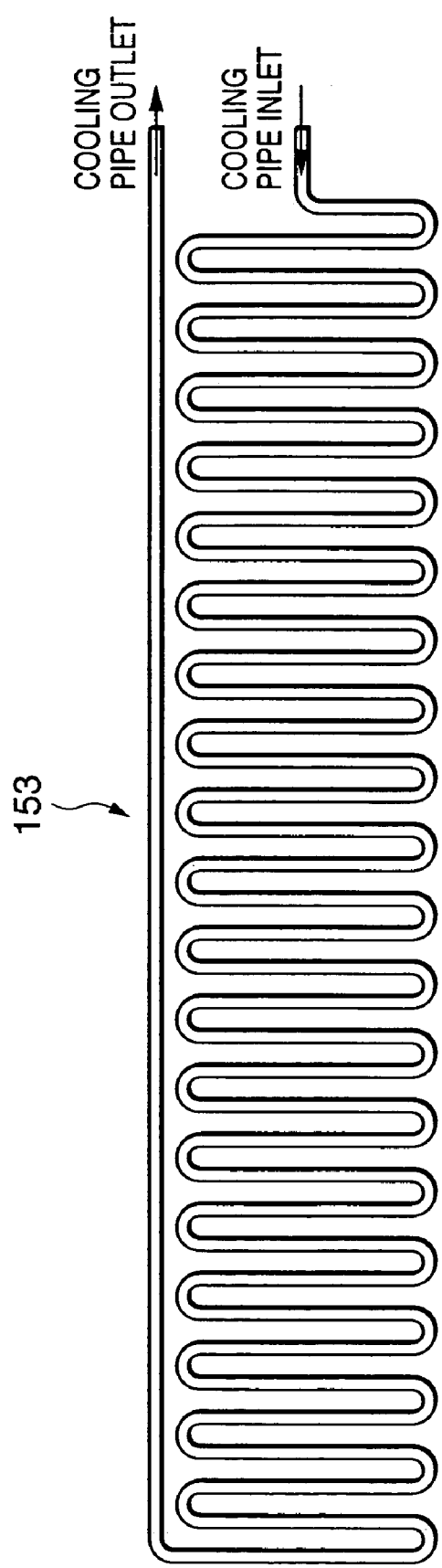
FIG. 6 is a plan view showing the second arrangement example of the first cooling pipe interposed between divided coils.
Figure 11:
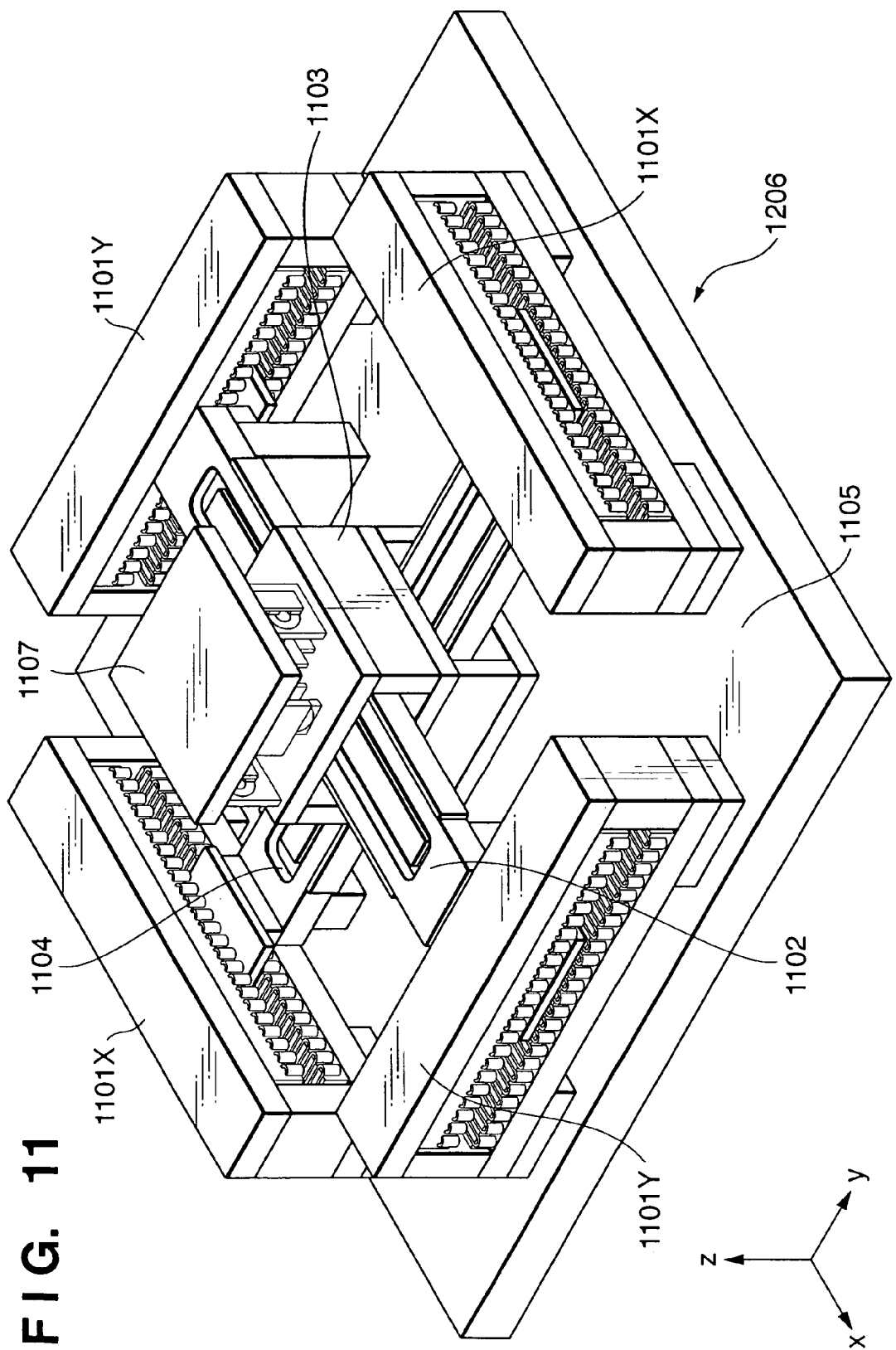
FIG. 11 is a perspective view showing the schematic arrangement of a wafer stage to which the linear motor according to the preferred embodiment of the present invention is applied.

Another arrangement of the cooling pipe will be described as a modification to the above embodiment. In the arrangement shown in FIG. 6, a cooling pipe inlet 153$a$ for supplying a coolant and a cooling pipe outlet 153$b$ for recovering the coolant are arranged at the same end out of two ends in the moving direction of the movable element. Arranging the inlet and outlet at the same end can simplify the pipe mounting arrangement. More specifically, when the linear motor having the pipe arrangement shown in FIG. 6 is applied to a stage apparatus as shown in FIG. 11, cooling pipes extending from respective linear motors can be concentrated at two corners. Further, pipes from the chamber to the outside can also be concentrated at two portions. This simple arrangement can improve the reliability as well.

Figure 7:
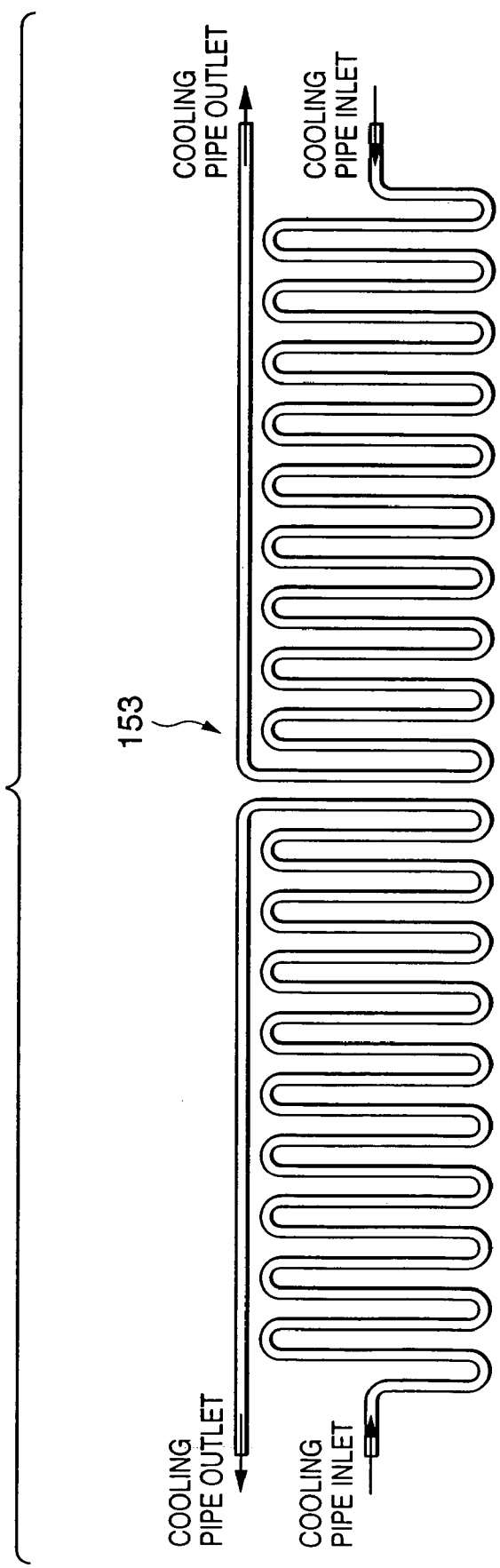
FIG. 7 is a plan view showing the third arrangement example of the first cooling pipe interposed between divided coils.
Figure 8:
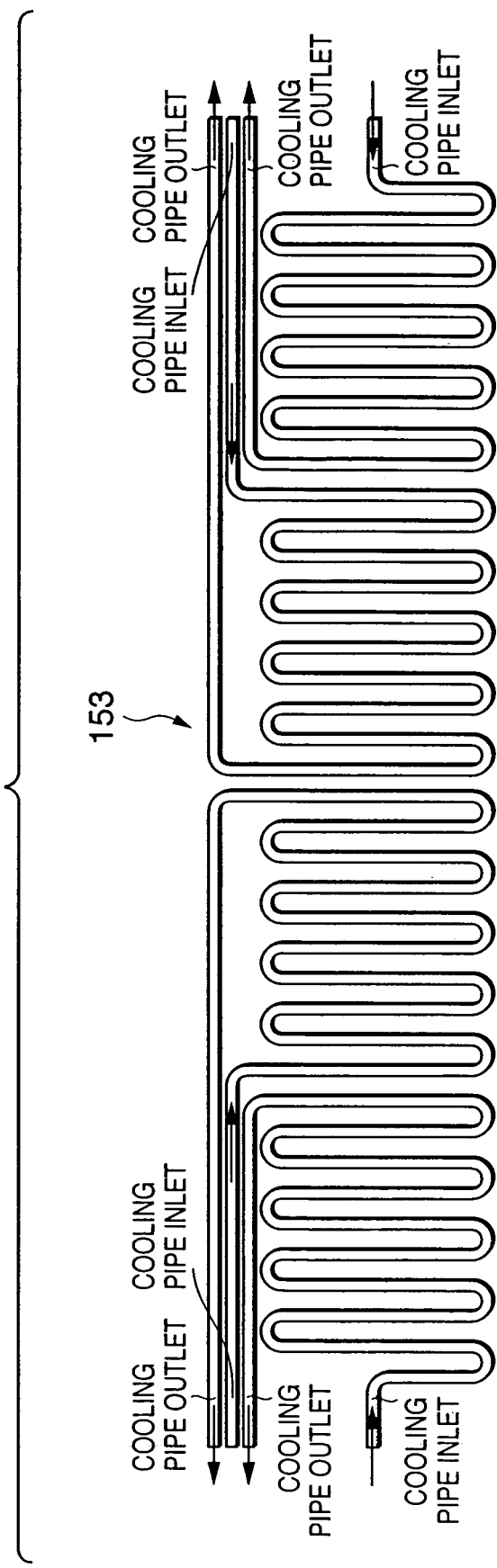
FIG. 8 is a plan view showing the fourth arrangement example of the first cooling pipe interposed between divided coils.

Even with these advantages, the pipe arrangement shown in FIG. 6 has a large pipe resistance because the cooling pipe is formed from one continuous pipe (series-connected pipes). To solve this problem, the cooling pipe may be divided into a plurality of blocks such as two or four blocks, as shown in FIGS. 7 and 8. In examples shown in FIGS. 7 and 8, blocks of series-connected pipes are parallel-connected. This division of the cooling pipe can decrease the number of U-shaped pipes for the pipe of one block, decreasing the pipe resistance. The pitch of the U-shaped pipes and the pitch (slot pitch) of the iron-core teeth of the stator yoke (laminated iron core) must coincide with each other. In the pipe arrangement shown in FIG. 6, the U-shaped pipe must be fabricated at a high precision or the pipe diameter must be set small in order to prevent a failure in fitting the pipe in the slot due to an increase in cumulative error along with an increase in the number of U-shaped pipes in a continuous pipe (series-connected pipes). By dividing the cooling pipe, the cumulative error in one block can be decreased. The work precision required for the U-shaped pipe can be set low, or the pipe diameter can be set large, and more efficient cooling can be achieved.

Figure 9:
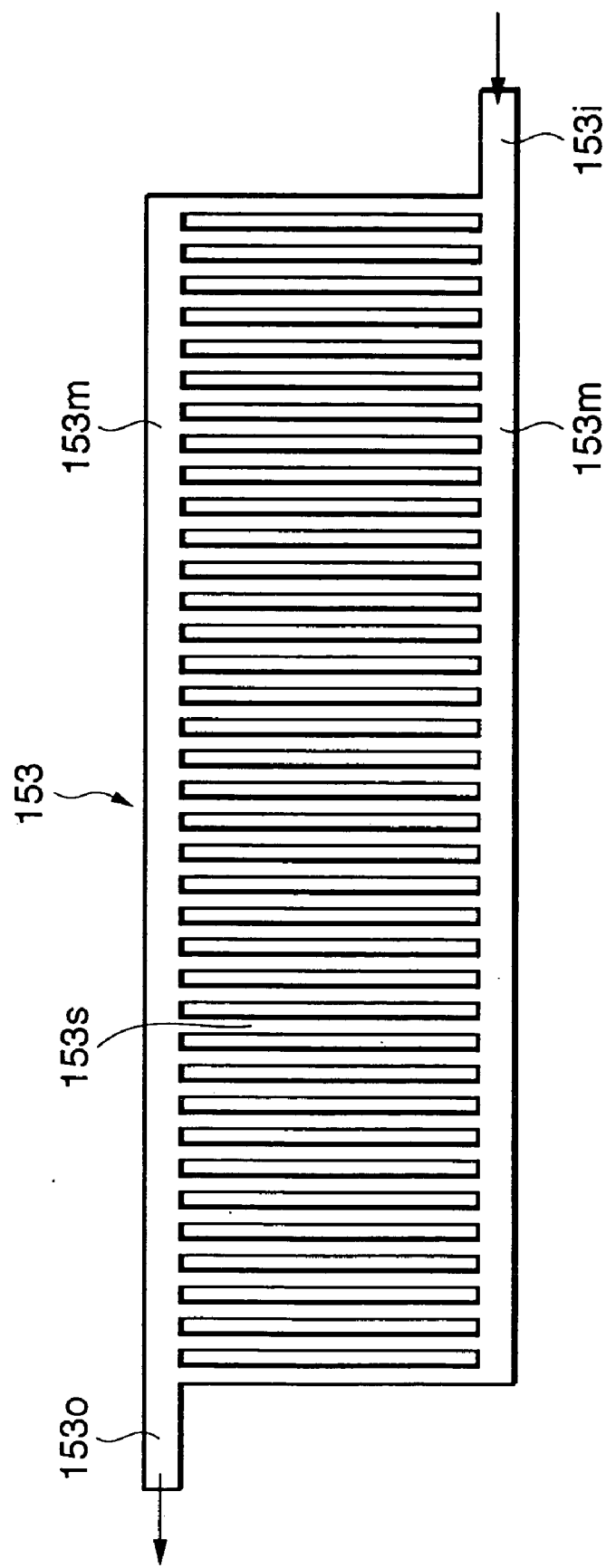
FIG. 9 is a plan view showing the fifth arrangement example of the first cooling pipe interposed between divided coils.

As still another arrangement, there is complete parallel piping as shown in FIG. 9. In the pipe arrangement shown in FIG. 9, the first cooling pipe 153 is made up of sub-cooling pipes 153$s$ which run between the iron-core teeth 151T (i.e., slots) of the stator yoke (laminated iron core) 151, and two main cooling pipes 153$m$ arranged on the two sides of the stator yoke 151. One main cooling pipe 153$m$ has a coolant supply inlet 15$i$, and the other main cooling pipe 153$m$ has a coolant recovery outlet 153$o$. The cooling pipe 153 is formed from the main cooling pipes 153$m$ and sub-cooling pipes 153$s$ into a ladder shape. The internal sectional area of one sub-cooling pipe 153$s$ is smaller than that of the main cooling pipe 153$m$. The cooling efficiency is higher as the sum of the internal sectional areas of the sub-cooling pipes 153$s$ is closer to the internal sectional areas of the main cooling pipes 153$m$.

Figure 10:
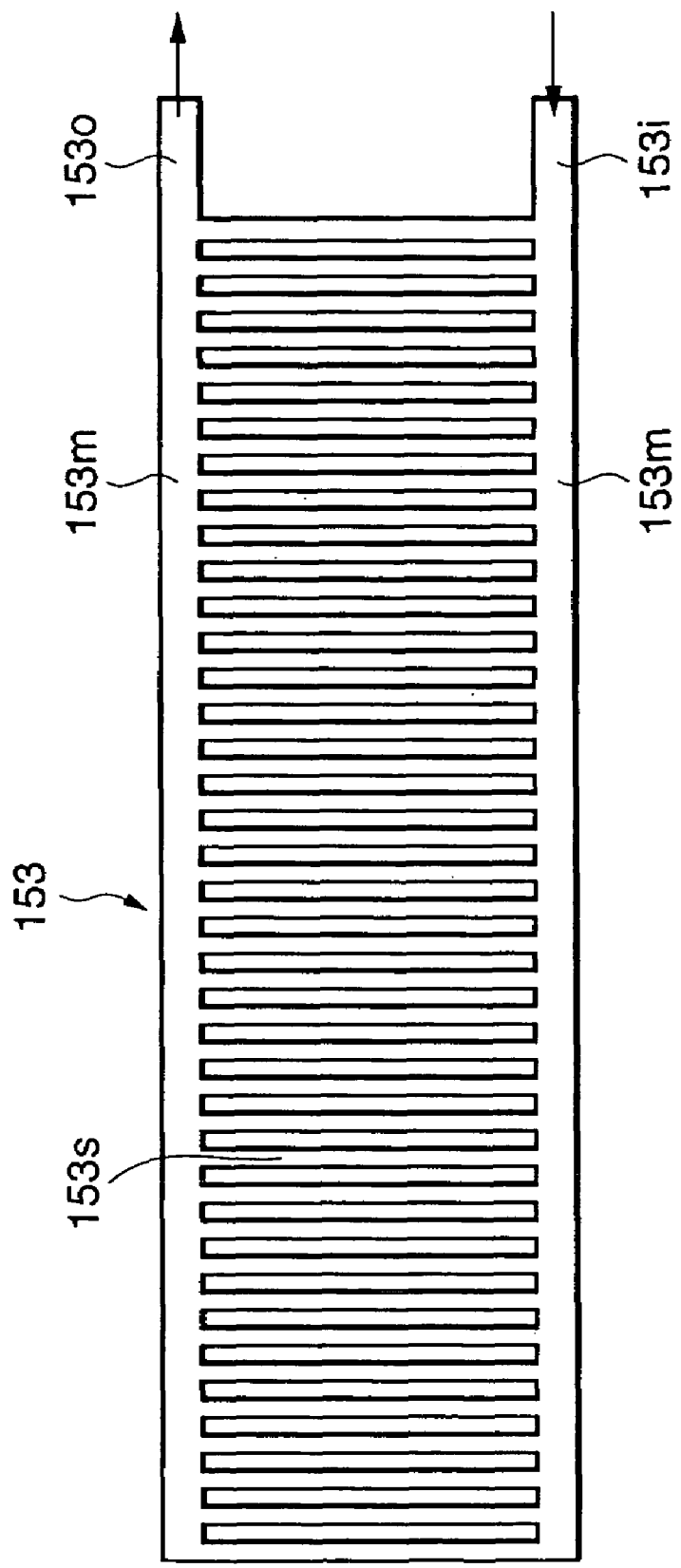
FIG. 10 is a plan view showing the sixth arrangement example of the first cooling pipe interposed between divided coils.

The inlet 153$i$ and outlet 153$o$ of the main cooling pipes 153$m$ are preferably formed in the same direction for mounting, as described with reference to FIG. 6. In this case, the cooling pipe 153 takes an arrangement as shown in FIG. 10. More specifically, the outlet 153$o$ of the main cooling pipe 153$m$ is arranged at a position opposite to the position in the arrangement of FIG. 9. Even if the position of the outlet 153$o$ (or inlet 153$i$) is opposite to that in the arrangement of FIG. 9, the cooling efficiency hardly changes. To obtain a uniform cooling effect in the whole stator 150, a plurality of sub-cooling pipes 153$s$ preferably have the same pipe diameter. Demands have arisen for downsizing a linear motor applied to the stage apparatus of a semiconductor manufacturing apparatus, and the slot width must be reduced. "To change a pipe running through the small-width slot" means "to make a thin pipe much thinner", decreasing the total cooling efficiency. Even if a given portion may be concentratedly used in accordance with the driving pattern, the diameters of all the sub-cooling pipes are preferably the same.

The sub-cooling pipe 153$s$ and main cooling pipe 153$m$ are connected by, e.g., welding. The pipe may be a circular-sectional pipe, a rectangular-sectional pipe, or a pipe with another shape.

Figure 12:
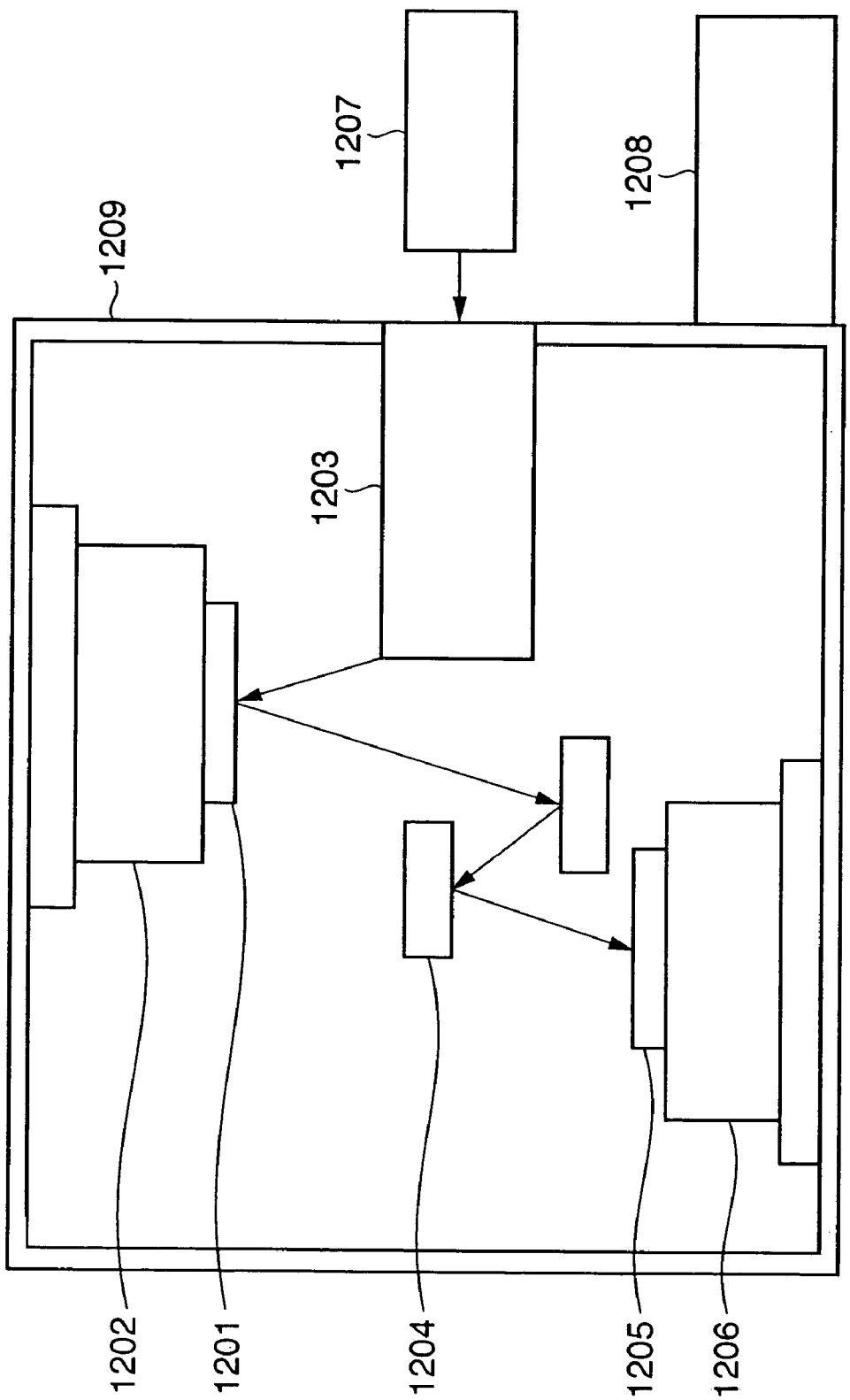
FIG. 12 is a view showing the concept of an EUV scanning projection exposure apparatus.
Figure 13:
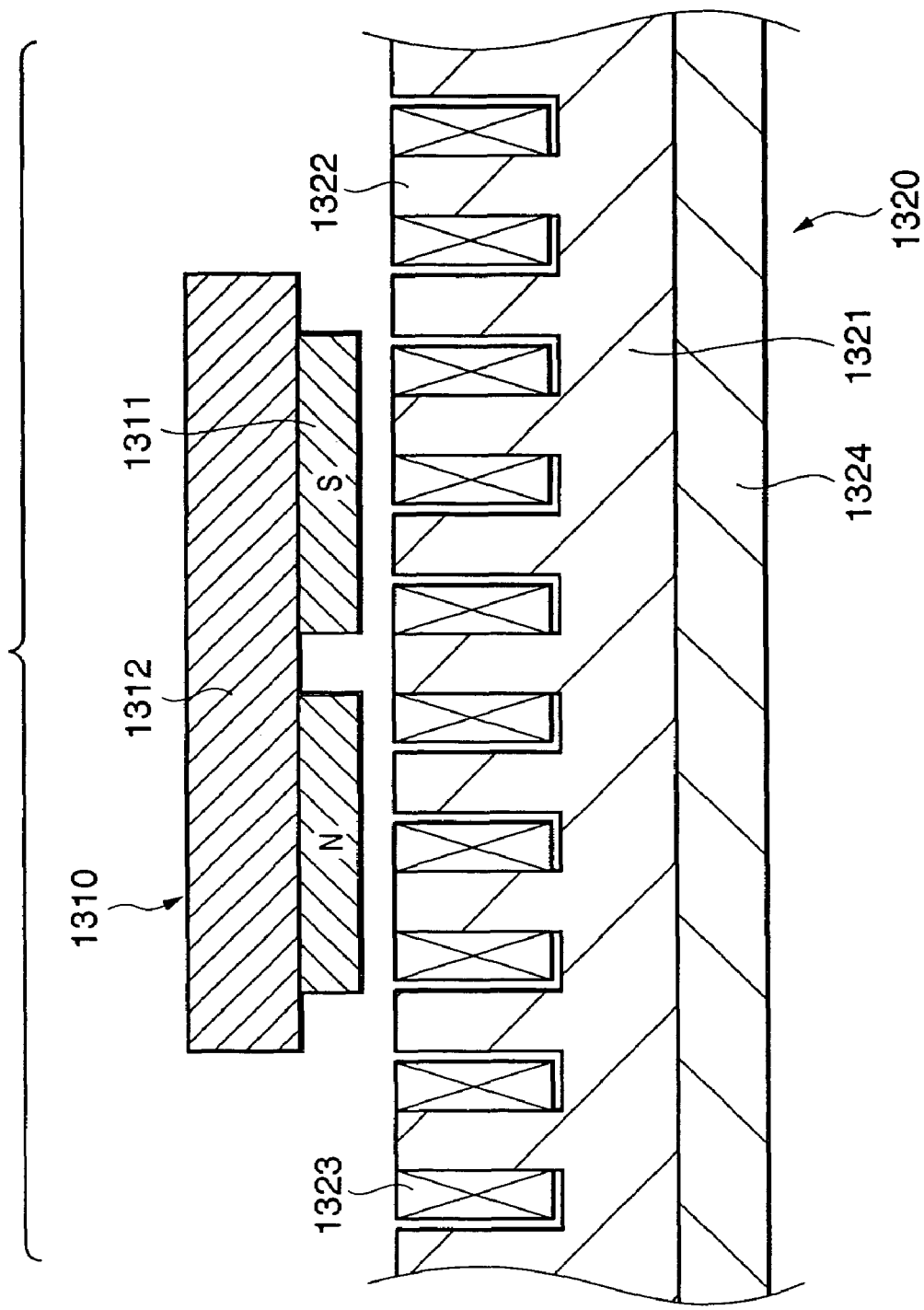
FIG. 13 is a sectional view showing the arrangement of a conventional linear motor.

An application of the linear motor of the present invention to the stage apparatus of a device manufacturing apparatus for an exposure apparatus will be described. FIG. 12 is a view showing the schematic arrangement of an exposure apparatus as an example of the apparatus to which the linear motor of the present invention is applied. In the exposure apparatus shown in FIG. 12, a pattern formed on a mask (master) 1201 is transferred onto a wafer 1205 via a projection optical system 1204. This exposure apparatus comprises the reflecting mask 1201, the projection optical system 1204 constituted by a reflecting optical system, a mask stage 1202 which holds the mask 1201, and a wafer stage 1206 which holds the wafer (substrate) 1205. The exposure apparatus is a step & scan projection exposure apparatus using, as exposure illumination light, EUV (Extreme Ultra Violet) light having an oscillation spectrum of 5 to 15 nm (soft X-ray region).

As described above, the exposure apparatus is equipped with the wafer stage 1206 which moves the wafer, and the mask stage 1202 which moves the mask. The linear motor of the present invention can be applied to at least either of these stages. The linear motor applied to the exposure apparatus hardly outgases adopts an arrangement free from outgassing of hydrocarbon or the like so as to maintain a high degree of vacuum. This can minimize the fogging of the mirror surface upon EUV exposure. The linear motor can minimize the temperature rise by the above-described arrangement in which the cooling pipe is interposed between divided partial coils. While a high alignment precision is maintained, a large thrust can be generated, thereby obtaining high productivity.

An application of the linear motor of the present invention to the wafer stage 1206 shown in FIG. 12 will be exemplified. The stators of X linear motors 1101X and Y linear motors 1101Y are actually closed by the partitions 180, as shown in FIG. 2. In FIG. 11, the coil and stator yoke (laminated iron core) are exposed for easy understanding. In the example shown in FIG. 11, the movable element of each linear motor is interposed between a pair of stators which are vertically arranged and face each other. For illustrative convenience, the first cooling pipe is not shown in FIG. 11. In practice, each coil unit of the linear motor is divided into upper and lower coils, and the first cooling pipe is interposed between them.

In FIG. 11, a fine moving stage 1107 comprises a hollow top plate made of an SiC composite material, alumina ceramics, or the like. A wafer chuck (not shown) is mounted on the hollow top plate in order to support a wafer as a photosensitive substrate. The wafer chuck is fixed to the top plate by vacuum air or a mechanical clamp (not shown). The wafer is also clamped onto the chuck by vacuum air or electrostatic force. To measure the relative position-of the wafer, a mirror and interferometer (neither is shown) are arranged. To measure the wafer position with six degrees of freedom, a plurality of mirrors are arranged.

A mechanism which supports the top plate and an actuator using electromagnetic force in order to move a wafer to a predetermined position with six degrees of freedom is arranged below the top plate. The actuator using electromagnetic force is a fine moving linear motor which is a Lorentz force actuator for controlling six degrees of freedom.

The actuator can precisely drive a wafer, but its stroke is short. Thus, the fine moving stage 1107 is mounted on an X-Y slider 1103 capable of long-stroke movement. A wafer can be so moved as to expose the entire wafer surface. The linear motors 1101X and 1101Y to which the cooling method of the present invention is applied are mounted as the actuator for long-stroke movement.

The X-Y slider 1103 is driven in the X and Y directions by an X slider 1104 and Y slider 1102 which cross each other.

Hydrostatic bearings (bottoms) for supporting the weight of the X slider 1104 are located at the two legs of the X slider 1104. Gas such as air, nitrogen, or helium is supplied to the hydrostatic bearings to float the X slider 1104 from a stage surface plate 1105. The hydrostatic bearings are vacuum hydrostatic bearings having a recovery function so as to prevent leakage of gas such as air, nitrogen, or helium in order to use the fine moving stage 1107 in vacuum. The two legs of the Y slider also have the same structure. The X slider 1104 and Y slider 1102 can move on the stage surface plate 1105. The driving force of the X slider 1104 is generated by two X linear motors 1101X arranged on the two sides of the X slider 1104. The moving magnets of the X linear motors 1101X are fixed to the moving side, i.e., the X slider 1104. Each X linear motor 1101X has a pair of upper and lower stators so as to sandwich the moving magnet of the X linear motor 1101X. Each stator comprises a laminated iron core and a coil unit divided into partial coils, as described above. The stator is fixed to the stage surface plate 1105. Note that the leg bottom of the stator may be supported by a vacuum hydrostatic bearing without fixing the stator to the stage surface plate 1105. This structure allows the stator of the linear motor to move in accordance with the ratio of the total mass of the fine moving stage 1107, X-Y slider 1103, and X slider 1104, and the mass of the stator of a linear motor 1101. That is, the reaction force upon moving the fine moving stage 1107, X-Y slider 1103, and X slider 1104.can be absorbed by the stator of the linear motor 1101. The Y slider also has the same arrangement.

The X-Y slider 1103 is slidably coupled to the X slider 1104 and Y slider 1102 via hydrostatic bearings in order to transmit horizontal driving force to the bridge of the X-Y slider 1103. Thrusts generated by the X and Y linear motors 1101X and 1101Y are transmitted to the X-Y slider 1103 via the hydrostatic bearings. As a result, the fine moving stage 1107 and the wafer on it are driven to target positions.

By applying the linear motors to the coarse and fine moving stages, high-precision fine moving control by the fine moving stage 1107 can be achieved. In addition, a large thrust can be obtained by the coarse moving linear motors 1101X and 1101Y which take a heat measure and an environment measure for vacuum or the like. The exposure apparatus can obtain high productivity.

In the above embodiment, the present invention is applied to a three-phase-driving moving-magnet linear motor. The present invention is not limited to this arrangement, and can also be applied to a two-phase-driving or moving-coil linear motor. In other words, the cooling method of the present invention can be applied to all linear motors having slots for storing coil units.

The present invention can also be applied to the use in the vacuum environment, the reduced-pressure atmosphere such as He, and outer air.

FIG. 22 is a schematic view for explaining the construction of an EUV exposure apparatusas an alternative example. The EUV exposure apparatus shown in FIG. 22 is a so-called step-and-scan exposure apparatus in which step movement between shot regions on a wafer and scan exposure within each shot region are repeated to carry out exposure of each shot region on the wafer. The EUV exposure apparatus is divided into a wafer stage section A, an optical system section C constituted by an optical system 12, and a mask stage section B. These sections are disposed in respective divided zones of a vacuum chamber 1209 in which a vacuum environment is maintained, and the interior of each zone of the vacuum chamber 1209 is held at a high vacuum by a corresponding vacuum pump 11.

The wafer stage shown in FIG. 11 will be described with reference to FIGS. 22 and 1. In the wafer stage shown in FIG. 11, forces generated by Y-linear motors 1101Y constituted by electromagnetic motors are transmitted through a Y-slider 1102 to move an XY-slider 1103 on a stage surface plate 1105 in the direction of a Y-axis, and forces generated by X-linear motors 1101X constituted by electromagnetic motors are transmitted through an X-slider 1104 to move the XY-slider 1103 on the stage surface plate 6 in the direction of an X-axis (FIG. 22 shows only the X-axis of X- and Y-axes).

A finely movable stage 1107 finely movable in 6-axis directions (X-axis, Y-axis, Z-axis, and rotating direction about each of the XYZ axes) is disposed on the wafer stage so that a semiconductor wafer 1205 as a substrate held on the finely movable stage 1107 can be positioned in the 6-axis directions with high accuracy. The finely movable stage 1107 is provided with linear motors 14 (only part of which is shown) constituted by electromagnetic motors for fine positioning and is also provided with electromagnetic joints 15 for transmitting forces when the wafer stage is accelerated or decelerated. Thus, the wafer 1205 can be moved in a non-contact relation to the XY-slider 1103.

Members of the finely movable stage 1107 on the side nearer to the wafer 1205 are supported relative to members of the finely movable stage 1107 on the side nearer to the XY-slider 1103 in a non-contact relation to each other through a magnetically repulsing support mechanism in which a spring property is negligible. With the provision of such a mechanism, disturbance vibrations, etc. are shut off from entering the members (positioning section) of the finely movable stage 1107 on the side nearer to the wafer 1205.

As shown in FIG. 1, each of the linear motor 1101X and 1101Y comprises a stator 150 which includes coils, and a mover 100 which is coupled to the slider (Y-slider 1102 or X-slider 1104) and includes magnets 102. The stator 150 and the mover 100 are separated from each other in a non-contact relation. The stator 150 is guided relative to the surface plate 1105 in a non-contact manner with the aid of vacuum static-pressure pads 5 shown in FIG. 22 such that the stator is moved while absorbing reaction forces generated by the linear motors 1101X and 1101Y.

The Y-slider 1102 or the X-slider 1104 coupled to the mover 100 is guided in a non-contact relation to the surface plate 1105 with the aid of the vacuum static-pressure pads 5, and is also guided in a non-contact relation to the XY-slider 1103 with the aid of electromagnetic guides not shown. Further, the XY-slider 1103 is guided in a non-contact relation to the surface plate 1105 with the aid of the vacuum static-pressure pads 5. In this embodiment, main structures of the wafer stage are all in a floating state in non-contact relation to each other.

A description will now be made of the mask stage. The mask stage is basically constructed in a vertical reversed relation to the wafer stage, and has a similar structure as the wafer stage in a point that the mask stage can also be positioned in the 6-axis directions. However, the mask stage does not include a structure corresponding to the X-linear motors 1101X and the X-slider 1104, and is movable in the X-direction only within a stroke range of a 6-axis finely movable stage 1107. Stated another way, in the scanning and exposing steps, the mask stage can be moved in the direction of the Y-axis by a small stroke driving mechanism combined with a large stroke driving mechanism not shown, and can be moved in the direction of the X-axis only by a small stroke driving mechanism.

With the wafer stage and the mask stage each having a multi-axis construction as described above, both stages can be positioned with higher accuracy and a greater degree of freedom, and they are flexibly adaptable for, e.g., synchronization errors in the scanning and exposing steps. It is also possible to flexibly compensate for a transfer error (e.g., a shift of the position where the substrate is placed) of the mask 1201 or the wafer 1205 caused upon transfer from a corresponding transport system.

Because the linear motors 1101X and 1101Y of the wafer stage and the mask stage are installed in the vacuum environment held within the vacuum chamber 1209, heat generated by upper and lower coils 161, 162 constituting a coil unit 160 shown in FIG. 1 cannot be transmitted for dissipation through air or an inert gas. Such a construction is advantageous in that the heat generated by the coils 161, 162 are prevented from being transmitted to the wafer stage and the mask stage through the air or the inert gas, while this feature gives rise to a new problem that the accumulated heat may cause an overheat damage of the coils 161, 162.

In the EUV exposure apparatus of this embodiment, therefore, the coil unit 160 must be cooled to an extent sufficient to avoid damage to the coils 161, 162, not for the purpose of preventing heat transmission from the linear motors 1101X and 1101Y to the surroundings thereof, but for protecting the coil unit 160 against overheat damage. To realize that purpose, in the EUV exposure apparatus of this embodiment, each of the linear motors 1101X and 1101Y for the wafer stage and the mask stage is cooled by circulating a coolant through the stator of the linear motors 1101X and 1101Y using a coolant circulating device 4 as shown in FIG. 22. Note that a part of the stator of the linear motors on the wafer stage side and the stator of the linear motors on the mask stage side are not shown.

The mover 100 and the stator 150 are guided by the surface plate 6 independently of each other, and are separated from each other in a non-contact relation while holding a certain gap between them. A stator yoke 151 is fixed to a stator mount base 170 in which second cooling pipes 171 are arranged. Then, as shown in FIG. 22, the stator mount base 170 is guided in a non-contact relation to the surface plate 1105 with the aid of the vacuum static-pressure pads 5.

The linear motor shown in FIG. 1 is able to function alone as a driving device. In this embodiment, however, the linear motor is arranged as shown in FIG. 11 in which two linear motors are arranged in vertically opposed relation in the direction of the Z-axis and further arranging the field permanent magnets 102 on each of upper and lower surfaces of one moving yoke 101 for the purpose of increasing the constant of propulsion.

Because the stator yoke 151 is disposed in the vacuum environment and is thermally shut off from the other components including the mask stage and the wafer stage (specifically the positioning members), it can be considered that the coil unit 160 as a source of generating heat in the stator yoke 151 will hardly impose a thermal effect to the surroundings. In the EUV exposure apparatus of this embodiment, not only the stator 150, but also most of the other structural members are guided in a non-contact manner in the vacuum environment as described above, and therefore they can be said as being in a thermally insulated state.

Further, in the EUV exposure apparatus of this embodiment, because a position measuring optical path of a laser interferometer 9, which serves as a range finder for measuring the position of the mask stage or the wafer stage on the XYZ-coordinate system, is defined in the vacuum, there is no need to prevent the heat generation from the linear motor 3 for eliminating a fluctuation component otherwise occurred in an output of the laser interferometer 9.

For that reason, the EUV exposure apparatus of this embodiment is free of the necessity of cooling with such a high accuracy as controlling the surface temperature of the stator 150 at a level of $1/1000°$ C. to $1/10°$ C., which has been required in the past in conventional apparatus in which exposure is performed in air or an inert gas. Hence, the coolant circulating device 4 and so on may be a very simple and uncomplicated structure. As a matter course, the cooling may be performed at such high accuracy as controlling the surface temperature of the stator 150 at a level of $1/1000°$ C. to $1/10°$ C., but the highly accurate cooling is of no practical value.

Stated another way, in the EUV exposure apparatus of this embodiment, the coolant circulating device 4 is required only to prevent overheat of the linear motor. By cooling the linear motor such that a maximum temperature of the coils 161, 162 is held at, e.g., about 80° C. (or not higher than 80° C.), temperature changes of the mask 1201, the wafer 1205, and the mask and wafer stages as members for supporting them can be each held to $1/1000°$ C. or less. As a result, the coolant circulating device 4 can be noticeably simplified.

In the conventional apparatus in which exposure is performed in air or an inert gas, the coolant temperature has been set equal to the wafer temperature so that an object to be cooled is managed to be held at the wafer temperature. By contrast, in the EUV exposure apparatus of this embodiment, since the temperature of the stator yoke 151 does not affect the other components, the coolant temperature can be set lower than the wafer temperature. This increases flexibility in the selection of a cooling method.

While the respective linear motors 1101 of the mask stage and the wafer stage are cooled in this embodiment, the linear motors 1101 may be cooled, as required, for only one of the mask stage and the wafer stage.

Also, while this embodiment employs a construction in which the respective linear motors 3 of the mask stage and the wafer stage are arranged in the vacuum inside the chamber 1209, the present invention is not limited to such a construction. The linear motors 1101 for either one of the mask stage and the wafer stage may be arranged outside the chamber 1209. In that case, the coolant may be circulated from the coolant circulating device 4 to at least the linear motors 3 for the stage arranged inside the chamber 10.

Further, in addition to the EUV exposure apparatus, the present invention is also applicable to, for example, an EB exposure apparatus for projecting and exposing a pattern onto a semiconductor wafer as a substrate in a vacuum with an electron beam.

A production system for a device (semiconductor chip such as an IC or LSI, a liquid crystal panel, a CCD, a thin-film magnetic head, a micromachine, or the like) using the exposure apparatus will be exemplified. The system performs maintenance services such as trouble shooting, periodic maintenance, and software distribution for manufacturing apparatuses installed in a device manufacturing factory by utilizing a computer network outside the manufacturing factory.

Figure 17:
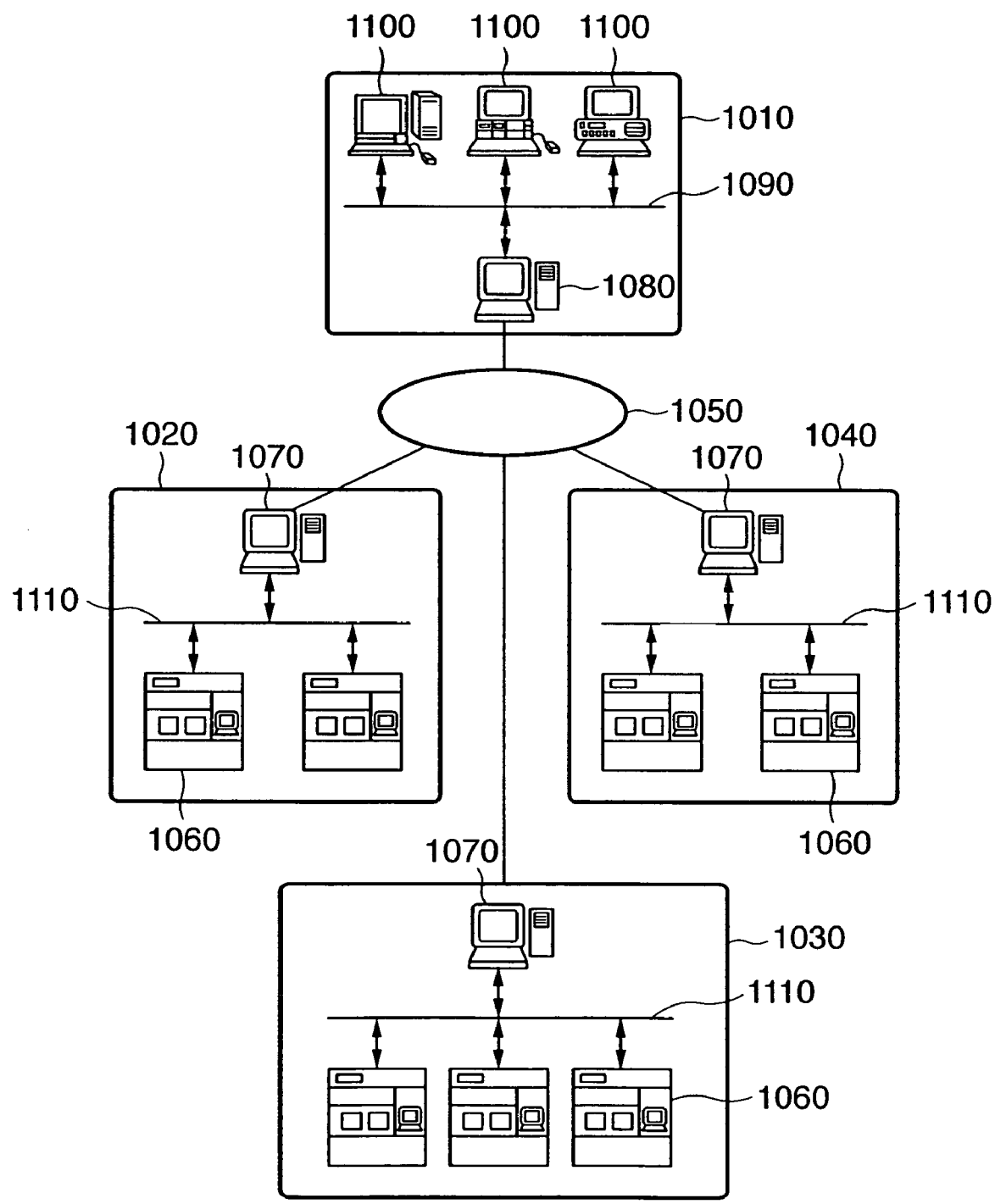
FIG. 17 is a view showing the concept of a production system for a device such as a semiconductor device when viewed from a given angle.

FIG. 17 shows the overall system cut out at a given angle. In FIG. 17, reference numeral 1010 denotes an office of a vendor (apparatus supply manufacturer) which provides a semiconductor device manufacturing apparatus. Examples of the manufacturing apparatus are semiconductor manufacturing apparatuses for various processes used in a semiconductor manufacturing factory, such as a pre-process apparatus (including an exposure apparatus), a resist processing apparatus, a lithography apparatus including an etching apparatus, an annealing apparatus, a film formation apparatus, a planarization apparatus, and a post-process apparatus (assembly apparatus, inspection apparatus, or the like). The office 1010 comprises a host management system 1080 which provides a maintenance database for the manufacturing apparatus, a plurality of operation terminal computers 1100, and a LAN (Local Area Network) 1090 which connects the host management system 1080 and computers 1100 to build an intranet. The host management system 1080 has a gateway for connecting the LAN 1090 to Internet 1050 serving as an external network of the office, and a security function for limiting external accesses.

Reference numerals 1020 to 1040 denote manufacturing factories of the semiconductor manufacturer as users of manufacturing apparatuses. The manufacturing factories 1020 to 1040 may belong to different manufacturers or the same manufacturer (pre-process factory, post-process factory, and the like). Each of the factories 1020 to 1040 is equipped with a plurality of manufacturing apparatuses 1060, a LAN (Local Area Network) 1110 which connects these apparatuses 1060 to construct an intranet, and a host management system 1070 serving as a monitoring apparatus which monitors the operation status of each manufacturing apparatus 1060. The host management system 1070 in each of the factories 1020 to 1040 has a gateway for connecting the LAN 1110 in the factory to the Internet 1050 serving as an external network of the factory. Each factory can access the host management system 1080 of the vendor 1010 from the LAN 1110 via the Internet 1050. The security function of the host management system 1080 typically authorizes access of only a limited user to the host management system 1080.

In this system, the factory can notify the vendor via the Internet 1050 of status information (e.g., the symptom of a manufacturing apparatus in trouble) representing the operation status of each manufacturing apparatus 1060. Also, the vendor can transmit, to the factory, response information (e.g., information designating a remedy against the trouble, or remedy software or data) corresponding to the notification, or maintenance information such as the latest software or help information. Data communication between the factories 1020 to 1040 and the vendor 1010 and data communication via the LAN 1110 in each factory typically adopt a communication protocol (TCP/IP) generally used in the Internet. Instead of using the Internet as an external network of the factory, a high-security dedicated network which inhibits access of a third party can be adopted. The host management system is not limited to the one provided by the vendor. The user may construct a database and set the database on an external network, and the host management system may authorize access to the database from a plurality of user factories.

Figure 18:
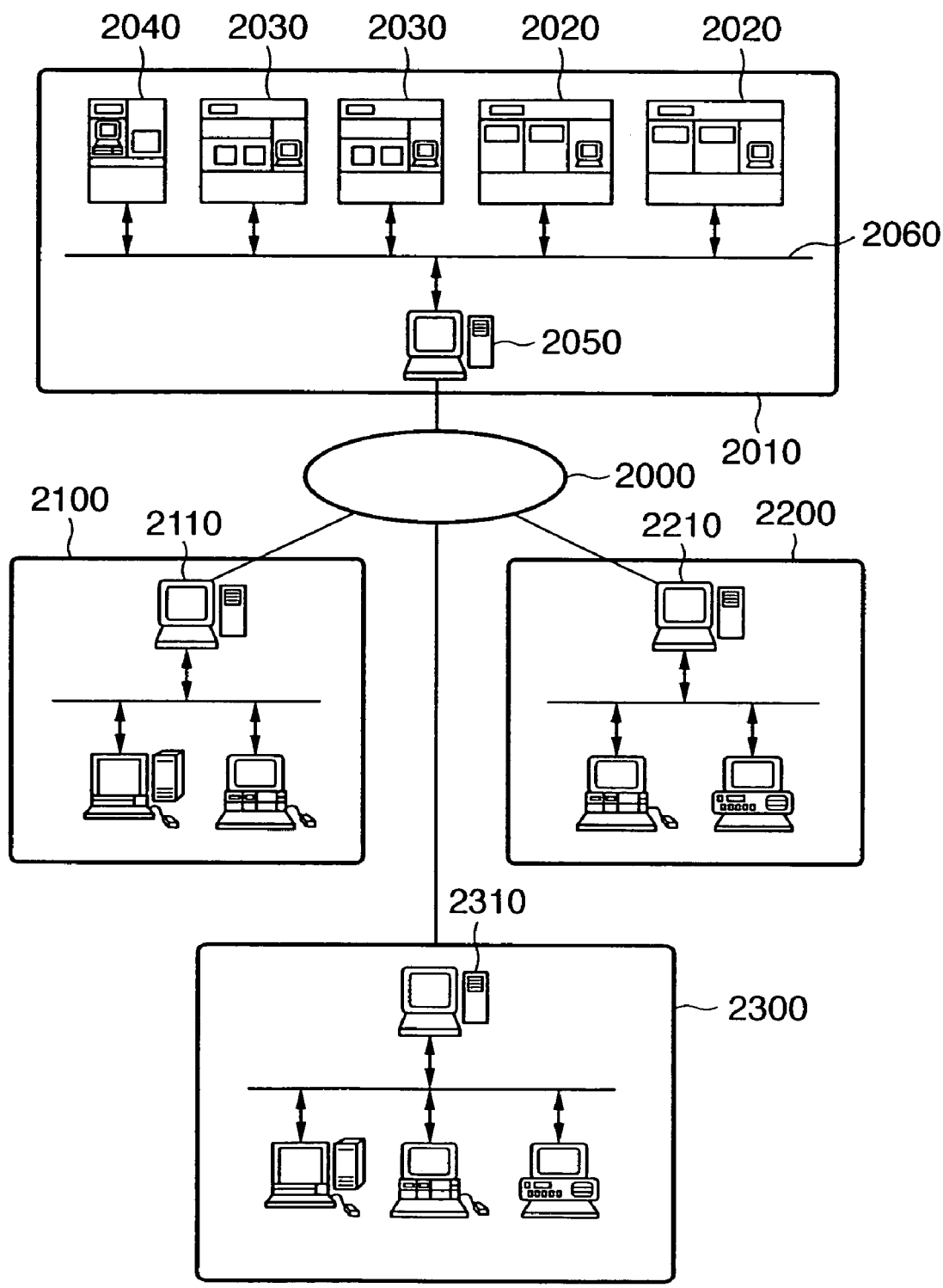
FIG. 18 is a view showing the concept of the production system for a device such as a semiconductor device when viewed from another angle.

FIG. 18 is a view showing the concept of the overall system of this embodiment that is cut out at a different angle from FIG. 17. In the above example, a plurality of user factories having manufacturing apparatuses and the management system of the manufacturing apparatus vendor are connected via an external network, and production management of each factory or information about at least one manufacturing apparatus is communicated via the external network. In the example of FIG. 18, a factory having manufacturing apparatuses provided by a plurality of vendors and the management systems of the vendors for these manufacturing apparatuses are connected via the external network of the factory, and maintenance information about each manufacturing apparatus is communicated. In FIG. 18, reference numeral 2010 denotes a manufacturing factory of a manufacturing apparatus user (semiconductor device manufacturer). Manufacturing apparatuses for various processes, e.g., an exposure apparatus 2020, resist processing apparatus 2030, and film formation apparatus 2040 are installed in the manufacturing line of the factory. FIG. 18 shows only one manufacturing factory 2010, but a plurality of factories are networked in practice. The respective apparatuses in the factory are connected to each other by a LAN 2060 to build an intranet, and a host management system 2050 manages the operation of the manufacturing line. The offices of vendors (apparatus supply manufacturers) such as an exposure apparatus manufacturer 2100, resist processing apparatus manufacturer 2200, and film formation apparatus manufacturer 2300 comprise host management systems 2110, 2210, and 2310 for executing remote maintenance for the supplied apparatuses. Each host management system has a maintenance database and a gateway for an external network, as described above. The host management system 2050 for managing the apparatuses in the manufacturing factory of the user, and the management systems 2110, 2210, and 2310 of the vendors for the respective apparatuses are connected via the Internet or dedicated network serving as an external network 2000. In this system, if a trouble occurs in any one of the manufacturing apparatuses along the manufacturing line, the operation of the manufacturing line stops. This trouble can be quickly solved by remote maintenance from the vendor of the apparatus in trouble via the Internet 2000. This can minimize the stop of the manufacturing line.

Each manufacturing apparatus in the semiconductor manufacturing factory comprises a display, a network interface, and a computer which executes network access software and apparatus operating software which are stored in a storage device. The storage device is a built-in memory, hard disk, or network file server. The network access software includes a dedicated or general-purpose web browser, and provides a user interface with a window as shown in FIG. 19 on the display. While referring to this window, the operator who manages manufacturing apparatuses in each factory inputs, into input fields on the windows, pieces of information such as the model of manufacturing apparatus (4010), serial number (4020), subject of trouble (4030), data of occurrence of trouble (4040), degree of urgency (4050), symptom (4060), remedy (4070), and progress (4080). The pieces of input information are transmitted to the maintenance database via the Internet, and appropriate maintenance information is sent back from the maintenance database and provided on the display. The user interface provided by the web browser realizes hyperlink functions (4100 to 4120), as shown in FIG. 19. This allows the operator to access more detailed information of each item, download the latest-version software to be used for a manufacturing apparatus from a software library provided by a vendor, and download an operation guide (help information) as a reference for the operator in the factory.

Figure 20:
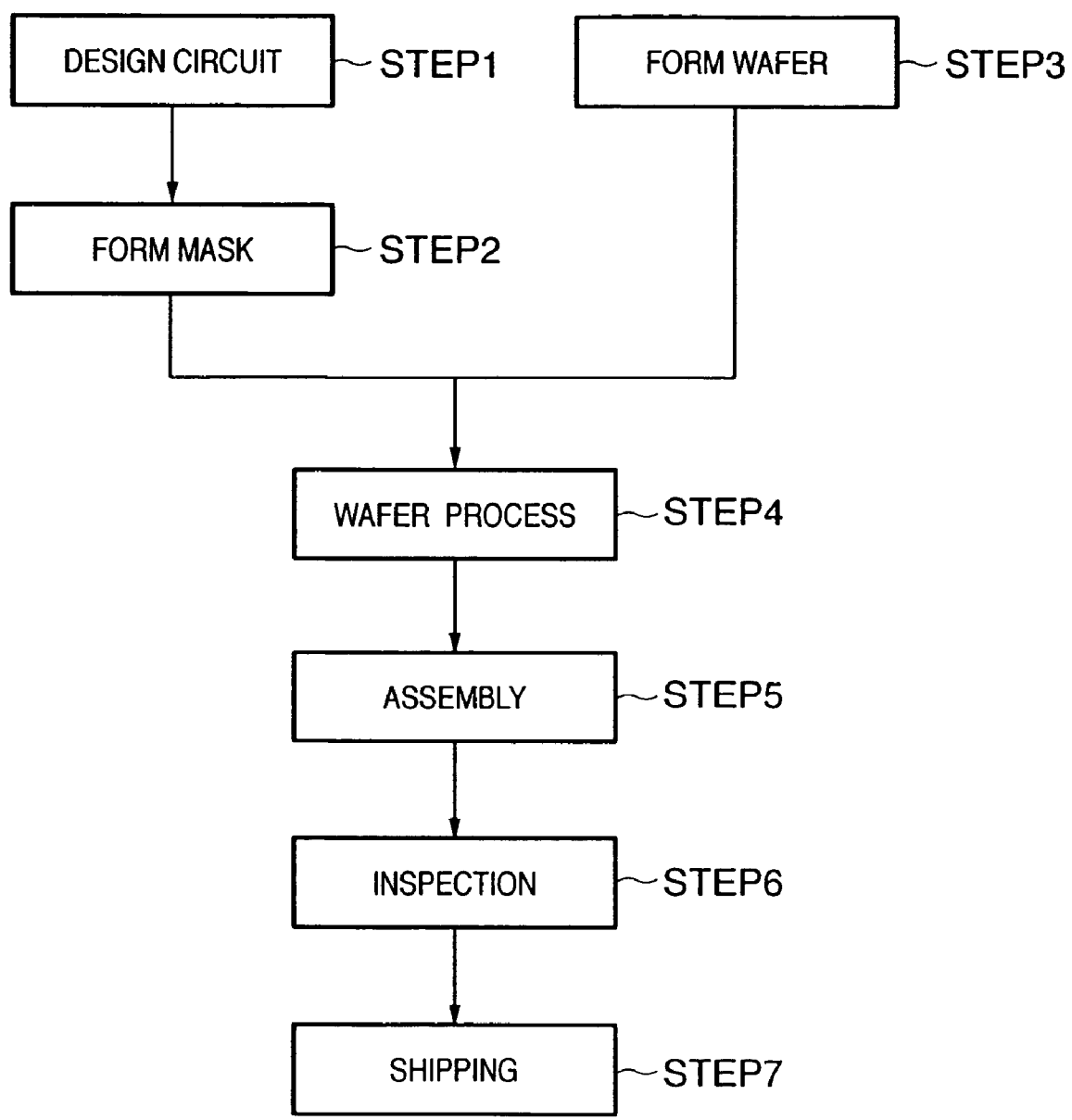
FIG. 20 is a flow chart for explaining the flow of a semiconductor device manufacturing process.

A semiconductor device manufacturing process using the above-described production system will be explained. FIG. 20 shows the flow of the whole manufacturing process of a semiconductor device. In step 1 (circuit design), a semiconductor device circuit is designed. In step 2 (mask formation), a mask is formed based on the designed circuit pattern. In step 3 (wafer formation), a wafer is formed using a material such as silicon. In step 4 (wafer process) called a pre-process, an actual circuit is formed on the wafer by lithography using the prepared mask and wafer. Step 5 (assembly) called a post-process is the step of forming a semiconductor chip by using the wafer formed in step 4, and includes an assembly process (dicing and bonding) and packaging process (chip encapsulation). In step 6 (inspection), the semiconductor device manufactured in step 5 undergoes inspections such as an operation confirmation test and durability test. After these steps, the semiconductor device is completed and shipped (step 7). For example, the pre-process and post-process may be performed in separate dedicated factories. In this case, each of the factories receives maintenance by the above-described remote maintenance system. Information for production management and apparatus maintenance may be communicated between the pre-process factory and the post-process factory via the Internet or dedicated network.

Figure 21:
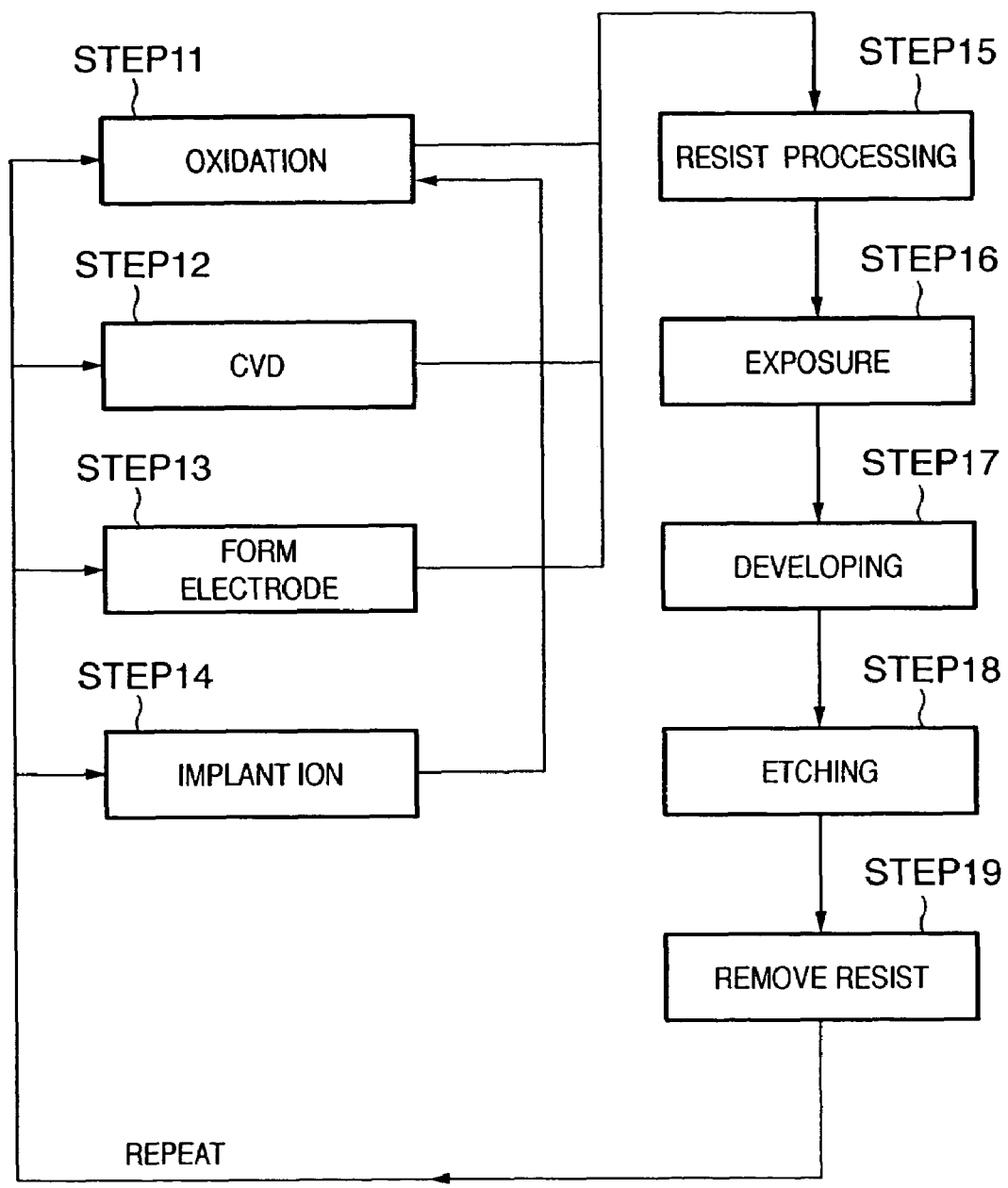
FIG. 21 is a flow chart for explaining details of a wafer process.

FIG. 21 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), a circuit pattern is transferred to the wafer by the above-described exposure apparatus. In step 17 (developing), the exposed wafer is developed. In step 18 (etching), the resist is etched except the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents a trouble in advance. Even if a trouble occurs, the manufacturing apparatus can be quickly recovered. The semiconductor device productivity can be increased in comparison with the prior art.

The present invention can increase, e.g., the cooling efficiency of a linear motor. As a result, a large current can be supplied to the coil of the linear motor, i.e., the linear motor output can be increased.

An exposure apparatus which incorporates this linear motor can drive the stage at a high speed, and increase the device productivity.

As many apparently widely different embodiments of the present invention can be made without departing from the spirit and scope thereof, it is to be understood that the invention is not limited to the specific embodiments thereof except as defined in the claims.

CLAIM OF PRIORITY

This application claims priority from Japanese Patent Application Nos. 2002-018939 filed on Jan. 28, 2002, and 2002-308058 filed on Oct. 23, 2002, which are hereby incorporated by reference herein.

What is claimed is:

1. A linear motor having a stator and a movable element, the motor comprising:
    a plurality of coil units arrayed in a moving direction of the movable element; and
    a coolant channel which is arranged in one plane and through which a coolant flows,
    wherein each of said plurality of coil units has at least two partial coils divided into a direction different from the moving direction of the movable element, said at least two partial coils including first and second partial coils, and
    the coolant channel is so arranged as to run between said first and second partial coils of all of said plurality of coil units.

2. The motor according to claim 1, wherein
    the linear motor further comprises a yoke having a plurality of iron-core teeth corresponding to said respective coil units, and
    each of said plurality of coil units is divided in a direction of depth of the plurality of iron-core teeth.

3. The motor according to claim 2, wherein a heat transfer substance is filled in gaps between the iron-core teeth, the partial coils, and the coolant channel.

4. The motor according to claim 3, wherein the heat transfer substance includes a resin.

5. The motor according to claim 3, wherein
    the linear motor further comprises a wall which surrounds said yoke,
    said wall has a structure usable as a vessel which is arranged outside said yoke before hardening the heat transfer substance and used to harden the heat transfer substance,
    a top portion of said wall and a side portion of said wall are made of a nonmagnetic material, and
    said stator and said movable member are opposed via the top portion of said wall.

6. The motor according to claim 2, wherein the coolant channel is formed from copper or stainless steel.

7. The motor according to claim 2, wherein the stator out of the stator and the movable element includes said plurality of coil units, said yoke, and the coolant channel.

8. The motor according to claim 1, wherein the movable element out of the stator and the movable element includes said plurality of coil units, said yoke, and the coolant channel.

9. The motor according to claim 1, further comprising:
a yoke having a plurality of iron-core teeth corresponding to said respective coil units,
a support which supports said yoke;
a coolant channel provided to said yoke; and
a heat transfer substance arranged between at least a part of said yoke and said support.

10. A stage apparatus comprising:
a linear motor defined in claim 1; and
a stage which is driven by a movable element of said linear motor.

11. An exposure apparatus comprising a stage apparatus defined in claim 10 as at least either of a master stage and a substrate stage.

12. A semiconductor manufacturing factory comprising:
a plurality of semiconductor manufacturing apparatuses including an exposure apparatus defined in claim 11;
a local area network which connects said plurality of semiconductor manufacturing apparatuses; and
a gateway which connects said local area network and an external network outside the semiconductor manufacturing factory.

13. A device manufacturing method comprising the steps of:
installing a plurality of semiconductor manufacturing apparatuses including an exposure apparatus defined in claim 11 in a factory; and
manufacturing a semiconductor device by using the plurality of semiconductor manufacturing apparatuses.

14. The method according to claim 13, further comprising the steps of:
connecting the plurality of semiconductor manufacturing apparatuses by a local area network;
connecting the local area network and an external network outside the factory;
acquiring information about the exposure apparatus from a database on the external network by using the local area network and the external network; and
controlling the exposure apparatus on the basis of the acquired information.

15. A device manufacturing method comprising the steps of:
exposing a substrate to a pattern by an exposure apparatus defined in claim 11; and
developing the exposed substrate.

16. An exposure apparatus maintenance method comprising the steps of:
preparing a database for accumulating information about maintenance of an exposure apparatus defined in claim 15 on an external network outside a factory where the exposure apparatus is installed;
connecting the exposure apparatus to a local area network in the factory; and
maintaining the exposure apparatus on the basis of the information accumulated in the database by using the external network and the local area network.

17. A linear motor having a stator and a movable element, the motor comprising:
a plurality of coil units arrayed in a moving direction of the movable element, each of said plurality of coil units having at least two partial coils;
a first coolant channel through which a coolant flows and which is so arranged as to run between said at least two partial coils constituting each of said plurality of coil units; and
a yoke having a plurality of iron-core teeth corresponding to said respective coil units,
wherein said at least two partial coils of each of said plurality of coil units are divided in a direction of depth of the plurality of iron-core teeth, and
the first coolant channel comprises
a plurality of first straight portions which run between the plurality of iron-core teeth,
a second straight portion which is coupled to the plurality of first straight portions on one of two sides of said yoke, and
a third straight portion which is coupled to the plurality of first straight portions on the other side of the two sides of said yoke.

18. The motor according to claim 17, wherein the plurality of first straight portions are smaller in sectional area than the second and third straight portions.

19. The motor according to claim 17, wherein a sum of sectional areas of the plurality of first straight portions is substantially equal to a sectional area of each of the second and third straight portions.

20. A linear motor having a stator and a movable element, the motor comprising:
a plurality of coil units arrayed in a moving direction of the movable element, each of said plurality of coil units having at least two partial coils;
a first coolant channel through which a coolant flows and which is so arranged as to run between said at least two partial coils of each of said plurality of coil units;
a yoke having a plurality of iron-core teeth corresponding to said respective coil units, said at least two partial coils of each of said plurality of coil units being divided in a direction of depth of the plurality of iron-core teeth;
a support which supports said yoke; and
a second coolant channel which is formed in said support and used to supply the coolant;

21. A linear motor having a stator and a movable element, the motor comprising:
a plurality of coil units arrayed in a moving direction of the movable element, each of said plurality of coil units having at least two partial coils;
a first coolant channel through which a coolant flows and which is so arranged as to run between said at least two partial coils of each of said plurality of coil units;
a yoke having a plurality of iron-core teeth corresponding to said respective coil units, said at least two partial coils of each of said plurality of coil units being divided in a direction of depth of the plurality of iron-core teeth;
a support which supports said yoke;
a second coolant channel which is formed in said support and used to supply the coolant.
a first heat transfer substance filled in gaps between the iron-core teeth, the partial coils, and the first coolant channel; and
a second heat transfer substance arranged between at least a part of said yoke and said support.

22. The motor according to claim 21, wherein the second heat transfer substance includes a resin.

23. The motor according to claim 21, wherein said support has a plurality of contacts in contact with said yoke, and the second heat transfer substance is interposed between the plurality of contacts.

24. A linear motor having a stator and a movable element, the motor comprising:
- a plurality of coil units arrayed in a moving direction of the movable element, each of said plurality of coil units having at least two partial coils;
- a first coolant channel through which a coolant flows and which is so arranged as to run between said at least two partial coils constituting each of said plurality of coil units; and
- a yoke having a plurality of iron-core teeth corresponding to said respective coil units,
- wherein said at least two partial coils of each of said plurality of coil units are divided in a direction of depth of the plurality of iron-core teeth, and
- the first coolant channel is meandered between the plurality of iron-core teeth.

25. The motor according to claim 24, wherein
the first coolant channel comprises
a plurality of straight portions which run between the plurality of iron-core teeth, and
a plurality of U-shaped portions which couple the plurality of straight portions to form a continuous channel,
the plurality of U-shaped portions are alternately arranged on right and left sides, and
the plurality of straight portions and the plurality of U-shaped portions constitute a structure in which the first coolant channel is meandered between the plurality of iron-core teeth.

26. The motor according to claim 25, wherein
the structure in which the first coolant channel is meandered between the plurality of iron-core teeth has first and second ends,
the first coolant channel further comprises a second straight portion which is coupled to the first end and extends from the first end to the second end,
the second straight portion is arranged along the other side of the two sides of said yoke, and
an inlet and an outlet of the first coolant channel are arranged at one of two ends of said yoke in a longitudinal direction.

27. The motor according to claim 25, wherein an extraction line of each of said plurality of coil units is extracted between one U-shaped portion and an adjacent U-shaped portion.

28. The motor according to claim 27, wherein the extraction line of each of said plurality of coil units is extracted from one of two sides of said yoke.

29. A linear motor having a stator and a movable element, the motor comprising:
- a plurality of coil units arrayed in a moving direction of the movable element, each of said plurality of coil units having at least two partial coils;
- a first coolant channel through which a coolant flows and which is so arranged as to run between said at least two partial coils constituting each of said plurality of coil units; and
- a yoke having a plurality of iron-core teeth corresponding to said respective coil units,
- wherein said at least two partial coils of each of said plurality of coil units are divided in a direction of depth of the plurality of iron-core teeth, and
- an inlet and an outlet of the first coolant channel are arranged at one of two ends of said yoke in a longitudinal direction.

30. A linear motor having a stator and a movable element, the motor comprising:
- a plurality of coil units arrayed in a moving direction of the movable element, each of said plurality of coil units having at least two partial coils;
- a first coolant channel through which a coolant flows and which is so arranged as to run between said at least two partial coils constituting each of said plurality of coil units; and
- a yoke having a plurality of iron-core teeth corresponding to said respective coil units,
- wherein said at least two partial coils of each of said plurality of coil units are divided in a direction of depth of the plurality of iron-core teeth, and
- the first coolant channel is divided into a plurality of blocks.

31. A linear motor having a stator and a movable element, the motor comprising:
- a plurality of coil units arrayed in a moving direction of the movable element, each of said plurality of coil units having at least two partial coils;
- a first coolant channel through which a coolant flows and which is so arranged as to run between said at least two partial coils of each of said plurality of coil units;
- a yoke having a plurality of iron-core teeth corresponding to said respective coil units, said at least two partial coils of each of said plurality of coil units being divided in a direction of depth of the plurality of iron-core teeth;
- a support which supports said yoke;
- a second coolant channel which is formed in said support and used to supply the coolant; and
- a heat transfer substance filled in gaps between the iron-core teeth, the partial coils, and the first coolant channel, said heat transfer substance including a resin,
- wherein the first coolant channel includes a pipe formed from copper or stainless steel, and
- a portion of the first coolant channel that is exposed outside a wall surrounding said yoke is electropolished.

* * * * *

UNITED STATES PATENT AND TRADEMARK OFFICE
CERTIFICATE OF CORRECTION

PATENT NO.        : 7,282,821 B2
APPLICATION NO.   : 11/138567
DATED             : October 16, 2007
INVENTOR(S)       : Hiroyoshi Kubo et al.

It is certified that error appears in the above-identified patent and that said Letters Patent is hereby corrected as shown below:

TITLE PAGE ITEM [75] INVENTORS:

"Hiroyoshi Kubo, Tochiqi-ken (JP);" should read --Hiroyoshi Kubo, Tochigi-ken (JP)--.

COLUMN 8:

Line 18, "cooing" should read --cooling--.
Line 21, "cooing" should read --cooling--.

COLUMN 15:

Line 24, "position-of" should read --position of--.

COLUMN 16:

Line 4, "1104. can" should read --1104 can--.
Line 32, "apparatusas" should read --apparatus as--.

COLUMN 18:

Line 26, "yoke 101" should read --yoke 151--.

COLUMN 21:

Line 20, "data" should read --date--.

UNITED STATES PATENT AND TRADEMARK OFFICE
CERTIFICATE OF CORRECTION

PATENT NO. : 7,282,821 B2
APPLICATION NO. : 11/138567
DATED : October 16, 2007
INVENTOR(S) : Hiroyoshi Kubo et al.

It is certified that error appears in the above-identified patent and that said Letters Patent is hereby corrected as shown below:

<u>COLUMN 24</u>:

Line 43, "coolant;" should read --coolant.--.
Line 58, "coolant." should read --coolant;--.

Signed and Sealed this

Eighteenth Day of November, 2008

JON W. DUDAS
*Director of the United States Patent and Trademark Office*